(12) United States Patent
Takagi et al.

(10) Patent No.: US 6,595,628 B2
(45) Date of Patent: Jul. 22, 2003

(54) LAMINATED PIEZOELECTRIC ELEMENT FOR USE AS A DRIVE DEVICE

(75) Inventors: Atsuhiro Takagi, Kariya (JP); Akiyoshi Kitazima, Inazawa (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 10/076,278

(22) Filed: Feb. 19, 2002

(65) Prior Publication Data

US 2002/0113847 A1 Aug. 22, 2002

(30) Foreign Application Priority Data

Feb. 19, 2001 (JP) ........................... 2001-041146
Mar. 1, 2001 (JP) ........................... 2001-056801
Mar. 1, 2001 (JP) ........................... 2001-056802

(51) Int. Cl.⁷ ............................. B41J 2/045
(52) U.S. Cl. ................................ 347/72
(58) Field of Search .................. 347/68, 70–72; 310/328, 366, 365

(56) References Cited

U.S. PATENT DOCUMENTS

| 5,402,159 | A | 3/1995 | Takahashi et al. |
| 6,273,558 | B1 | 8/2001 | Kitahara |
| 2002/0003560 | A1 * | 1/2002 | Isono et al. .................. 347/72 |
| 2002/0024567 | A1 * | 2/2002 | Takagi ......................... 347/72 |
| 2003/0001931 | A1 * | 1/2003 | Isono ........................... 347/72 |

\* cited by examiner

*Primary Examiner*—Judy Nguyen
(74) *Attorney, Agent, or Firm*—Oliff & Berridge, PLC

(57) ABSTRACT

A reliable piezoelectric actuator whose warpage is prevented and of which electrodes are prevented from peeling off, and an ink-jet print head including the piezoelectric actuator are manufactured. A piezoelectric sheet having individual electrodes formed thereon and another piezoelectric sheet having common electrodes formed thereon are stacked alternately on top of each other in layers, with an insulating sheet having surface electrodes placed on the top. Each piezoelectric sheet has through holes. The through holes are formed such that through holes adjacent in a direction parallel to the alignment of the individual electrodes are not aligned.

14 Claims, 21 Drawing Sheets

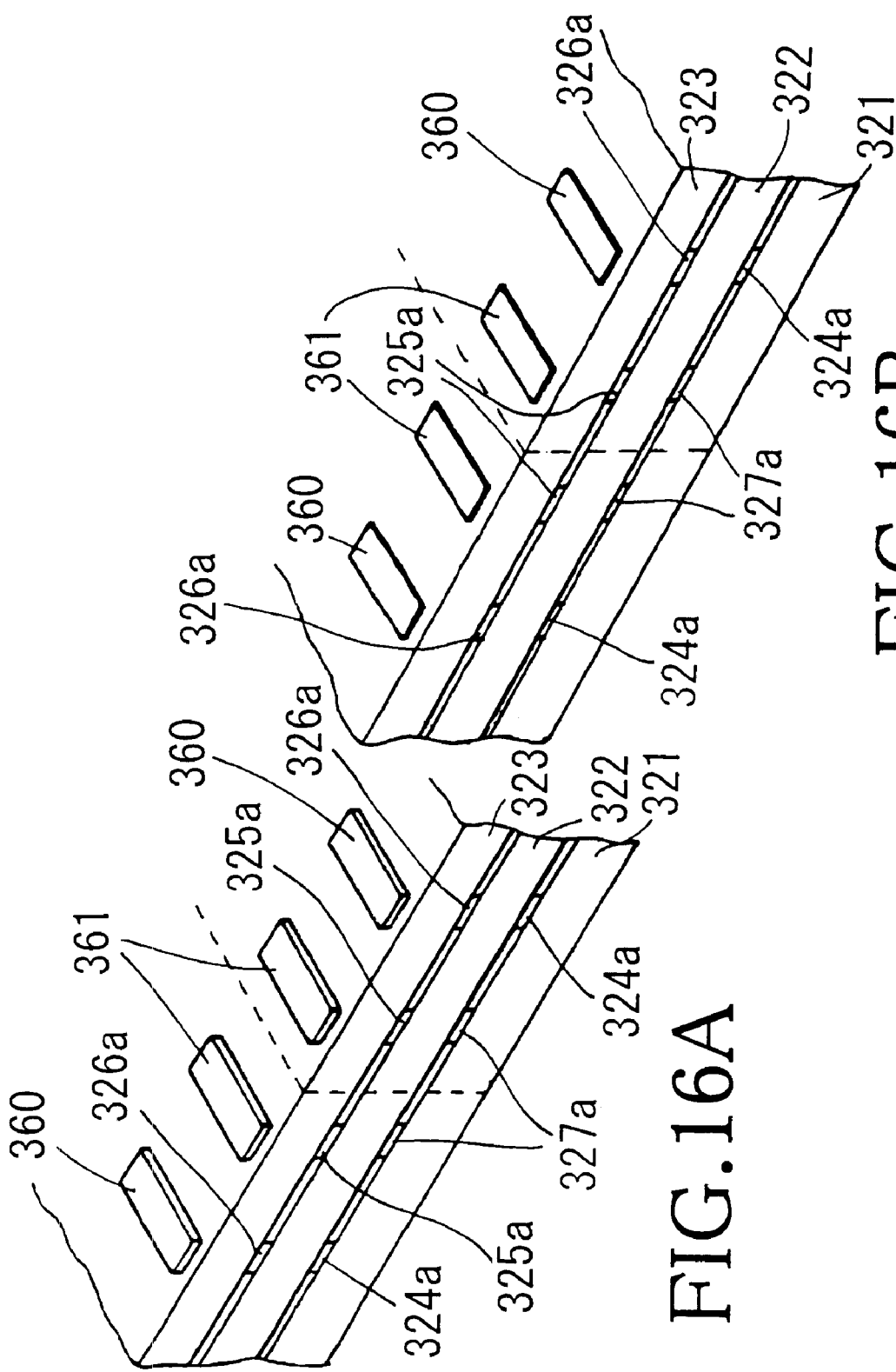

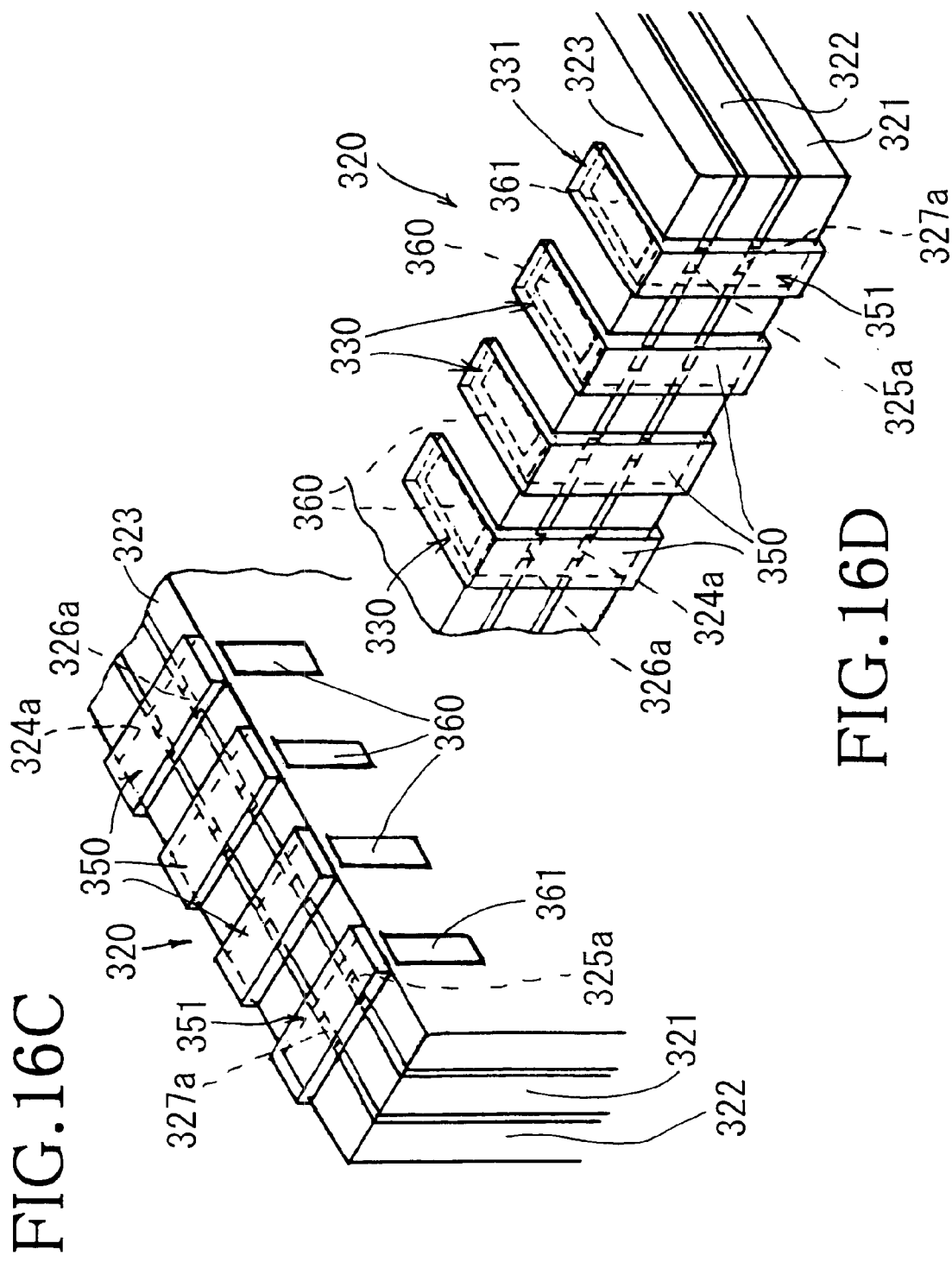

LAMINATED PIEZOELECTRIC ELEMENT FOR USE AS A DRIVE DEVICE

BACKGROUND OF THE INVENTION

1. Field of Invention

The invention relates to a laminated piezoelectric element for use as a drive device in various apparatus, such as an ink-jet print head.

2. Description of Related Art

A piezoelectric element is used as a drive device (piezoelectric actuator) for various apparatus due to a characteristic of converting electric energy into mechanical displacement (deformation) by piezoelectric effects. In order to increase an amount of displacement by the deformation of a piezoelectric element, the piezoelectric element includes laminated piezoelectric sheets formed of ceramic material, such as lead zirconate titanate (PZT). The piezoelectric sheet has individual electrodes or common electrodes formed on a surface (larger face) thereof with electrical conductive material of, for example, paste. A plurality of the piezoelectric sheets having the individual electrodes formed thereon and a plurality of piezoelectric sheets having the common electrodes formed thereon are alternately stacked on top of each other in layers.

In the thus laminated piezoelectric element, to electrically connect between the individual electrodes or between the common electrodes adjacent in a sheet laminated direction, through holes are provided to which electrically conductive material is applied. FIGS. 17 through 19 show an example of a known laminated piezoelectric element (piezoelectric actuator). FIG. 17 is an exploded view of a piezoelectric actuator 100. FIG. 18 is a sectional view of the actuator 100, taken along line 1005—1005 of FIG. 17. FIG. 19 is an explanatory view of the actuator 100 deformed by firing.

The conventional piezoelectric actuator 100 includes a piezoelectric sheet 103a, 103c, 103e, 103g having individual electrodes 101 formed thereon, and a piezoelectric sheet 103b, 103d, 103f, 103h having common electrodes 102 formed thereon, that are alternately laminated, and an insulating sheet 106 disposed on the top. The individual electrodes 101 are formed on the piezoelectric sheet 103a (103c, 103e, 103g), which is odd-numbered when counted from the lower side of the actuator 100. The individual electrodes 101 are provided so as to laterally extend along the shorter side of the piezoelectric sheet 103a (103c, 103e, 103g) toward a central portion thereof. A row of the individual electrodes 101 is provided parallel to the longitudinal direction of the sheet 103a (103c, 103e, 103g) along each longer side of the sheet 103a (103c, 103e, 103g). The common electrodes 102 are formed on the piezoelectric sheet 103b (103d, 103f, 103h), which is even-numbered when counted from the lower side of the actuator 100. The common electrode 102 is provided in a substantially central portion of the piezoelectric sheet 103b (103d, 103f, 103h). The common electrode 102 extends along the longitudinal direction of the piezoelectric sheet 103b (103d, 103f, 103h), forming a substantially rectangular shape.

In the piezoelectric sheets 103a through 103h, piezoelectric active portions 107 that are deformed by the piezoelectric effects are provided at positions sandwiched between the individual electrodes 101 and the common electrodes 102. Extending portions 102a are integrally formed with the common electrode 102 and extend laterally so as to cover a substantially entire length of each shorter side end of the even-numbered piezoelectric sheet 103b (103d, 103f, 103h).

Individual dummy electrodes 104 are formed so as to correspond to the individual electrodes 101 (in the vertically same positions), on the surfaces of the even-numbered piezoelectric sheet 103b (103d, 103f, 103h) other than the piezoelectric active portions 107.

Dummy common electrodes 105 are formed on each of the odd-numbered piezoelectric sheet 103a (103c, 103e, 103g) at positions corresponding to the extending portions 102a (in the vertically same positions). The insulating sheet 106 has surface electrodes 108 associated with the individual electrodes 101 and surface electrodes 109 associated with the common electrodes 102, along the longer sides of the sheet 106. Except for the lowermost piezoelectric sheet 103a, through holes 110 are formed on the piezoelectric sheet 103b through 103h and the insulating sheet 106, so as to communicate the surface electrodes 108 with the corresponding the individual electrodes 101 and individual dummy electrodes 104. Similarly, through holes 111 are formed on the piezoelectric sheet 103b through 103h and the insulating sheet 106, so as to communicate at least one surface electrode 109 with the corresponding extending portion 102a.

The individual electrodes 101 formed on the photoelectric sheets 103a, 103c, 103e, 103g and the associated surface electrodes 108 are electrically interconnected through electrically conductive material applied to the through holes 110. Similarly, the common electrodes 102 formed on the piezoelectric sheet 103b, 103d, 103f, 103h and the associated surface electrodes 109 are electrically interconnected through electrically conductive material applied to the through holes 111. The through holes 110, 111 are provided in a line parallel to an aligning direction of the individual electrodes 101 along the longitudinal direction of the piezoelectric sheet 103b through 103g and the insulating sheet 106, as shown in FIG. 17. The through holes 110, 111 are not formed on the lowermost piezoelectric sheet 103a, to prevent electricity from being conducted to a driven member (e.g., a cavity plate in an ink-jet head) to which the piezoelectric actuator 100 is fixedly attached.

Another known piezoelectric actuator includes an insulating sheet disposed on a larger surface of the piezoelectric sheet laminate. The insulating sheet includes surface electrodes connected to a flexible printed cable to externally and selectively drive the piezoelectric actuator by applying a voltage. The surface electrodes are formed on the insulating sheet so as to be associated with individual electrodes or the common electrodes. Conventionally, the surface electrodes are formed mainly with the following three methods.

As a first method to form the surface electrodes on the insulating sheet, the common electrodes and the individual electrodes are formed on the surfaces of the piezoelectric sheets. A common electrode or individual electrode is extended so as to be exposed on a side face of the piezoelectric sheets. A plurality of the piezoelectric sheets are laminated with the insulating sheet (that has not yet had a surface electrode) placed on the top. Such laminate of the piezoelectric sheets and the insulating sheet is sintered or fired at a high temperature (e.g., approximately 1100° C.). Thereafter, electrically conductive Ag—Pd (silver-palladium)-based paste is applied to a side end face of the laminate such that side electrodes are formed to connect between the common electrodes or between the individual electrodes in the sheet laminated direction. Then, the surface electrodes are formed on a surface (larger face) of the insulating sheet, so as to be electrically connected to the side surfaces, by applying the same electrically conductive material (paste) as that used for the side electrodes. The surface electrodes are baked at a relatively low temperature (e.g., approximately 600° C.).

As a second method, the common electrodes and the individual electrodes are formed on the piezoelectric sheets and the insulating sheet. The through holes are formed on the piezoelectric sheets and the insulating sheet such that the adjacent individual electrodes or the common electrodes in the sheet laminated direction are connected to each other. The same electrically conductive material (paste) as that used for the common electrodes and the individual electrodes is applied to the through holes. Thereafter, the piezoelectric sheets and the insulating sheet are laminated and fired at a high temperatures as described above. Then, the surface electrode is formed on a surface (larger face) of the insulating sheet for each of the through holes by applying electrically conductive Ag—Pd (silver-palladium)-based paste, and baking at a lower temperature.

As a third method, the common electrodes and the individual electrodes are formed on the piezoelectric sheets and the insulating sheet. The through holes are formed on the piezoelectric sheets and the insulating sheet such that the adjacent individual electrodes or the common electrodes in the sheet laminated direction are connected to each other. The same electrically conductive material (paste) as that used for the common electrodes and the individual electrodes is applied to the through holes. Tabs, as surface electrodes, are formed on a larger face of the insulating sheet with the same electrically conductive material as that used for the through holes, so that the tabs and the thorough holes are electrically connected. The piezoelectric sheets and the insulating sheet having the tabs formed on the insulating sheet are laminated and fired at a high temperature.

SUMMARY OF THE INVENTION

When the piezoelectric sheet 103a through 103h and the insulating sheet 106 are laminated as shown in FIG. 18, the through holes 110, 111 are aligned vertically so as to communicate in the sheet laminated direction, and along the longer side ends of the piezoelectric sheet 103b–103h and the insulating sheet 106. Accordingly, the piezoelectric actuator 100 has continuous low-strength areas near each longer side end thereof along the longitudinal direction.

In addition, the vertically aligned through holes 110, 111 that create low-strength areas, are substantially cylindrical in shape with a bottom of the lowermost piezoelectric sheet 103a. Therefore, the laminate formed of the piezoelectric sheets 103a–103h and the insulating sheet 106 (that is, the piezoelectric actuator 100) shrinks during firing, resulting in deformation, as shown in FIG. 19, so as to close the openings of the through holes 110, 111, when viewed from the lateral direction of the piezoelectric actuator 100. When the piezoelectric actuator 100 having a deformation, such as a curve or a warpage, is used as a drive device for an ink-jet print head, such deformation creates a gap when the piezoelectric actuator 100 is fixed to a surface of a cavity plate by adhesive, leading to ink leakage from the gap.

In the above-described first and second methods to form the surface electrodes, the surface electrodes baked at a lower temperature have lower strength of bonding to the surface of the insulating sheet. Therefore, when the piezoelectric actuator and the flexible printed cable are connected by soldering through the surface electrodes, the surface electrodes are peeled off the insulating sheet, resulting in an unstable electrical connection between the piezoelectric actuator and the flexible printed cable. Even when glass frit is mixed into the electrically conductive paste to improve the bonding strength of the surface electrodes, the degree of the bonding strength improvements is limited.

If the surface electrodes are formed by the above-described third method, the tabs, as the surface electrodes, that are fired at a high temperature shrink. Further, the surface of the tab is oxidized by the heat applied at a high temperature during firing. Therefore, it is difficult to solder the surface electrodes of the piezoelectric actuator and electrodes of the flexible printed cable with the sufficient strength.

One aspect of the invention is to manufacture a reliable piezoelectric actuator that prevents an electrode of the actuator from peeling off or prevents the actuator from warping. Another aspect of the invention is to provide an ink-jet print head including such a reliable piezoelectric actuator.

A laminated piezoelectric element of the invention may include a plurality of sheet members that include at least a plurality of piezoelectric sheets that form a laminate by stacking the plurality of the sheet members, electrode patterns that have at least first electrode patterns including a plurality of individual electrodes on each one of the first electrode patterns formed between the sheet members, and through holes that pierce through at least one of the sheet members which are internal layers of the laminate at least corresponding to the individual electrodes. The through holes electrically connect at least between the first electrode patterns by each of the individual electrodes adjacent in a lamination direction of the sheet members with an electrically conductive material applied to the through holes. The through holes are provided so as to prevent the through holes adjacent in a direction parallel to an alignment of the individual electrodes in the first electrode pattern from aligning along the direction parallel to the alignment of the individual electrodes in the at least one of the sheet members.

A method for manufacturing a laminated piezoelectric element that has a laminate formed by stacking a plurality of sheet members including at least a plurality of piezoelectric sheets, and that has electrode patterns with at least first electrode patterns, including a plurality of individual electrodes on each one of the first electrode patterns formed between the sheet members. The method for manufacturing may include steps of preparing a base sheet, whose size covers a plurality of the sheet members arranged in a matrix, boring though holes in the base sheet, at least at positions where the individual electrodes are due to be provided on each of the sheet members, in such a manner that the through holes are prevented from aligning along a direction parallel to an alignment of the individual electrodes, forming an electrode layer to be the electrode patterns on a surface of the base sheet, using an electrically conductive material and applying the electrically conductive material to the through holes, laminating a plurality of the base sheets and an insulating sheet such that the insulating sheet is placed uppermost, sintering the laminate formed by the base sheets and the insulating sheet, and cutting the laminate that is sintered, into a predetermined size to produce laminated piezoelectric elements.

In the laminated piezoelectric element and the method for manufacturing the laminated piezoelectric element according to the invention, the through holes may be provided in each of the sheet members so as to prevent the through holes adjacent in a direction parallel to an alignment of internal electrodes, such as preventing the individual electrodes from aligning along the direction parallel to the alignment of the internal electrodes. As the sheet members of the piezoelectric sheets having the through holes arranged as described above are laminated, the through holes may be disposed in a staggered configuration when viewed from the top of the laminated sheets. In this case, stresses in the laminated piezoelectric element caused by the shrinkage during firing may be dispersed. Therefore, the amount of deformation after sintering such that the openings of the through holes, which have a lower strength, are closed when viewed from a direction orthogonal to the direction parallel to the alignment of the internal electrodes, may be reduced.

Accordingly, when the laminated piezoelectric element is fixedly attached to a surface of a cavity plate in order to use the laminated piezoelectric element for an inkjet print head as a drive device, creation of the gap (space) between adhesive surfaces of the laminated piezoelectric element and the cavity plate may be prevented. Therefore, problems such as ink leakage may be prevented after the piezoelectric element and the cavity plate, bonded together, are assembled into a product of an ink-jet print head.

A method for manufacturing a laminated piezoelectric element that has a laminate formed by stacking a plurality of sheet members, including at least a plurality of piezoelectric sheets, and that has electrode patterns with at least first electrode patterns, including a plurality of individual electrodes, on each one of the first electrode patterns formed between the sheet members, may include steps of, preparing a base sheet and a insulating sheet whose size covers a plurality of the sheet members arranged in a matrix, forming an electrode layer to be the electrode patterns on a surface of a base sheet using an electrically conductive material, creating an electrode layer to be a pattern of tabs to be associated with the electrode pattern on the insulating sheet using an electrically conductive material, laminating a plurality of the base sheets and the insulating sheet such that the insulating sheet is placed uppermost in such a manner that the pattern of the tabs faces outwardly, sintering a laminate formed by stacking the plurality of the base sheets and the insulating sheet, cutting the laminate that is sintered, into a predetermined size according to the laminated piezoelectric element, forming surface electrodes of a electrically conductive material at least on the tabs to make connection at least between the individual electrodes adjacent in the lamination direction, and baking the surface electrodes.

According to the method of manufacturing the invention, the surface electrodes may be formed on the sheet member (base sheet), through the tabs formed of electrically conductive material. The tabs may be securely bonded to the sheet member at a high temperature while the laminate is sintered. In addition, the tabs and the surface electrodes may be both formed of electrically conductive material, so that the tabs and the surface electrodes may be securely bonded to each other even when the surface electrodes are baked at a low temperature. When the surface electrodes are baked at a low temperature, the surface electrodes will be less subjected to oxidation. Therefore, sufficient bonding strength may be ensured between the surface electrodes and the external connecting device, such as a flexible printed cable.

BRIEF DESCRIPTION OF THE DRAWINGS

Exemplary embodiments of the invention will be described in detail with reference to the following figures wherein like reference numerals designate like structural elements, and in which:

FIG. 16A is a partially perspective view of the piezoelectric actuator, showing one of manufacturing processes thereof, wherein the piezoelectric actuator is in a condition before being subjected to firing;

FIG. 16B is a partially perspective view of the piezoelectric actuator, showing one of manufacturing processes thereof, wherein the piezoelectric actuator is in a condition after being subjected to firing;

FIG. 16C is a partially perspective view of the piezoelectric actuator, showing one of manufacturing processes thereof, wherein side electrodes are formed by screen printing;

FIG. 16D is a partially perspective view of the piezoelectric actuator, showing one of manufacturing processes thereof, wherein surface electrodes are baked;

DETAILED DESCRIPTION OF PREFERRED EMBODIMENTS

Figure 1:
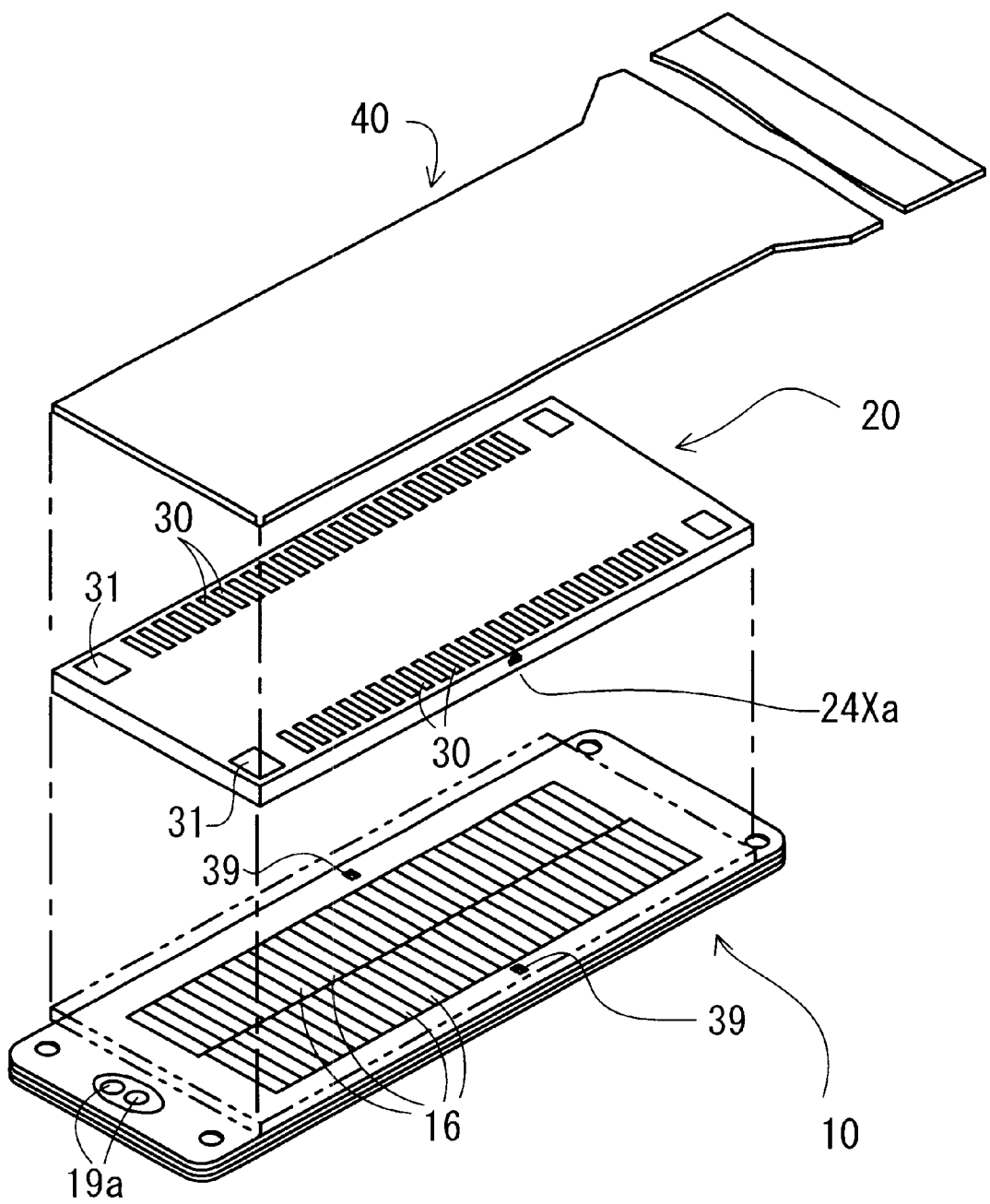
FIG. 1 is an exploded perspective view of a piezoelectric inkjet print head according to a first embodiment of the invention.

Exemplary embodiments of the invention will be described in detail with reference to FIGS. 1 through 16D, using a piezoelectric ink-jet print head as an example. It is to be noted that like elements are identified with like reference numerals in the following detailed description and in the accompanying drawings.

Figure 6:
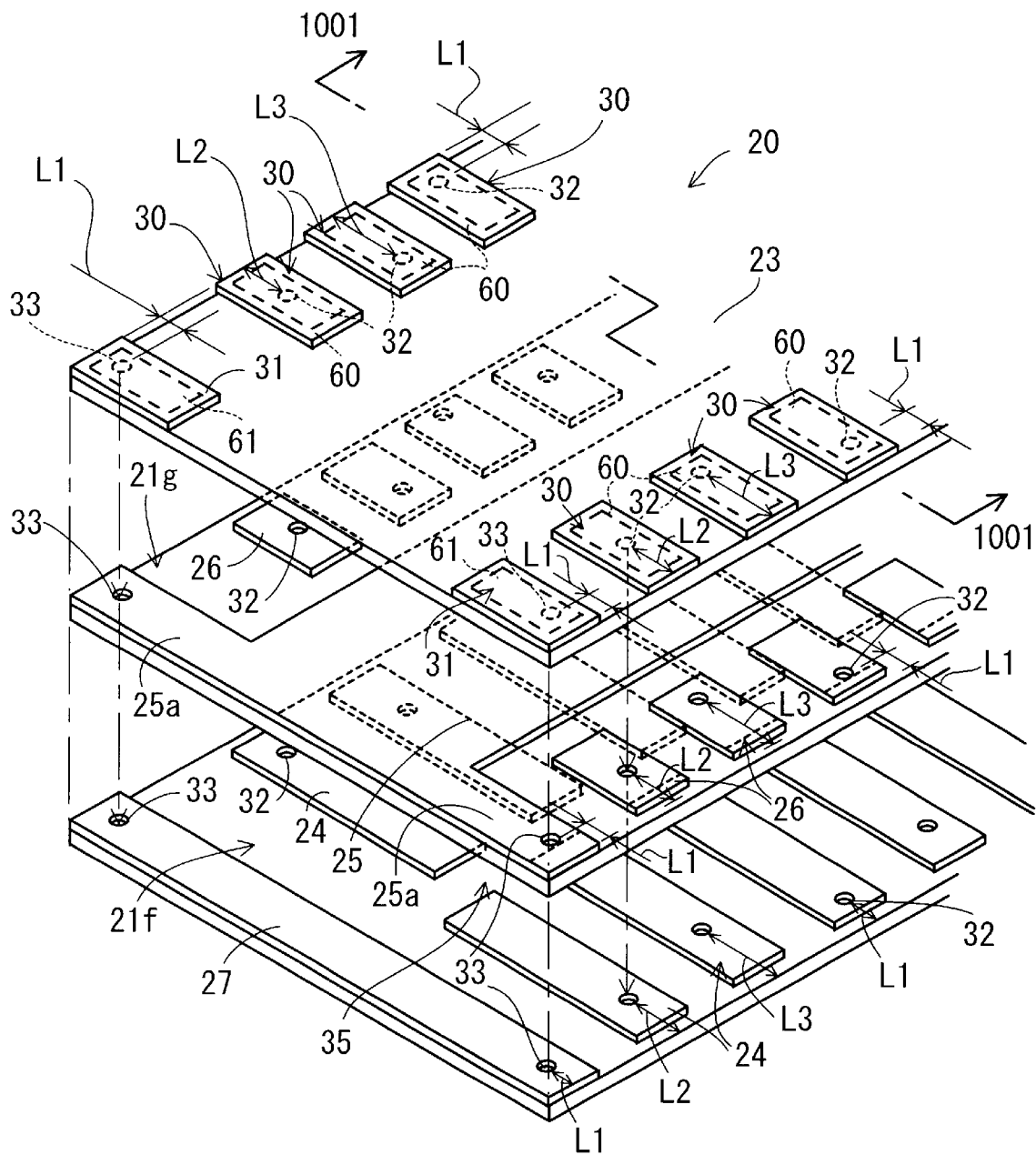
FIG. 6 is an enlarged expanded partially perspective view of the piezoelectric actuator.
Figure 7:
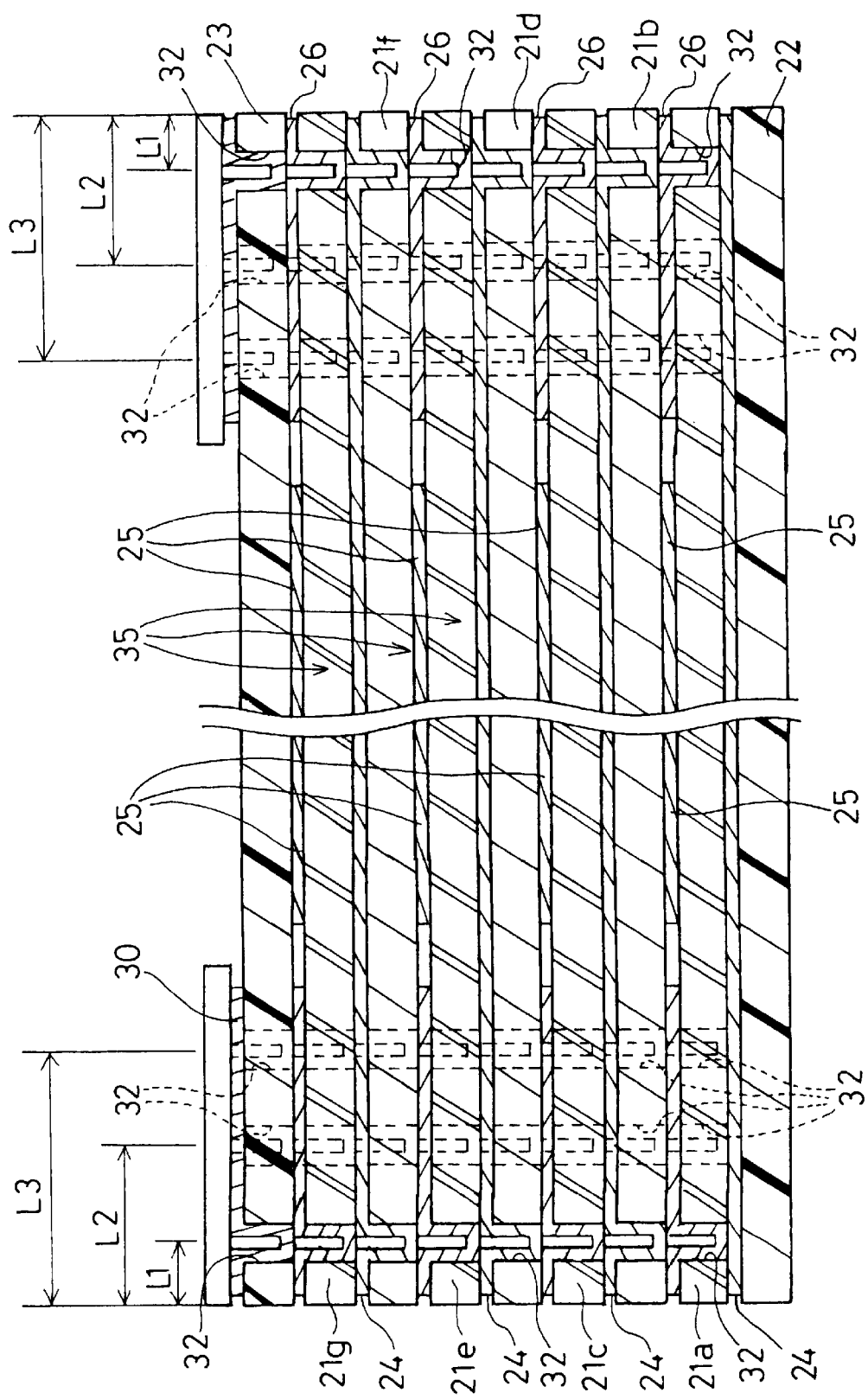
FIG. 7 is a cross sectional view of the piezoelectric actuator, taken along 1001—1001 of FIG. 6.
Figure 8:
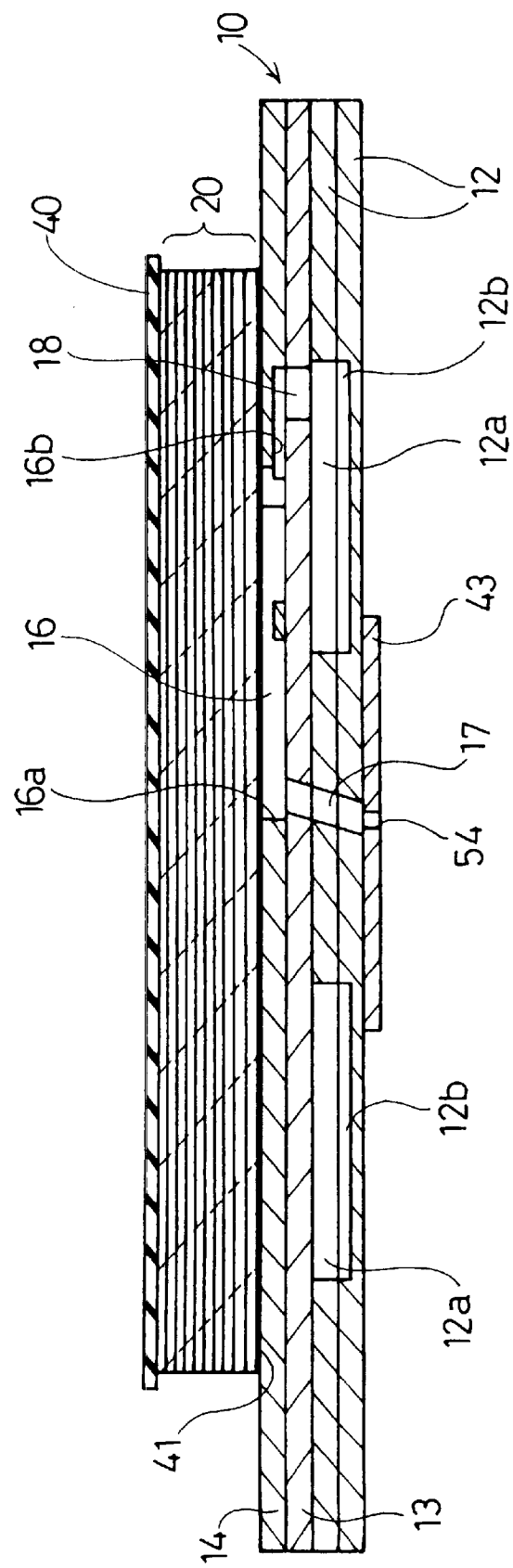
FIG. 8 is an enlarged sectional view of a flexible printed cable, the cavity plate, and the piezoelectric actuator that are laminated.

Referring to FIGS. 1 through 9, a first embodiment will be described below. As shown in FIGS. 1, 2A, 2B, and 8, a plate-like piezoelectric actuator 20 is bonded to a cavity plate 10 formed of metal sheets. A flexible printed cable 40 for connecting with an external device is bonded to an upper surface (larger face) of the piezoelectric actuator 20. Nozzles 54, as shown in FIGS. 2A and 8, are open downwardly to the lower side of the cavity plate 10, and eject ink downwardly therefrom.

Figure 3:
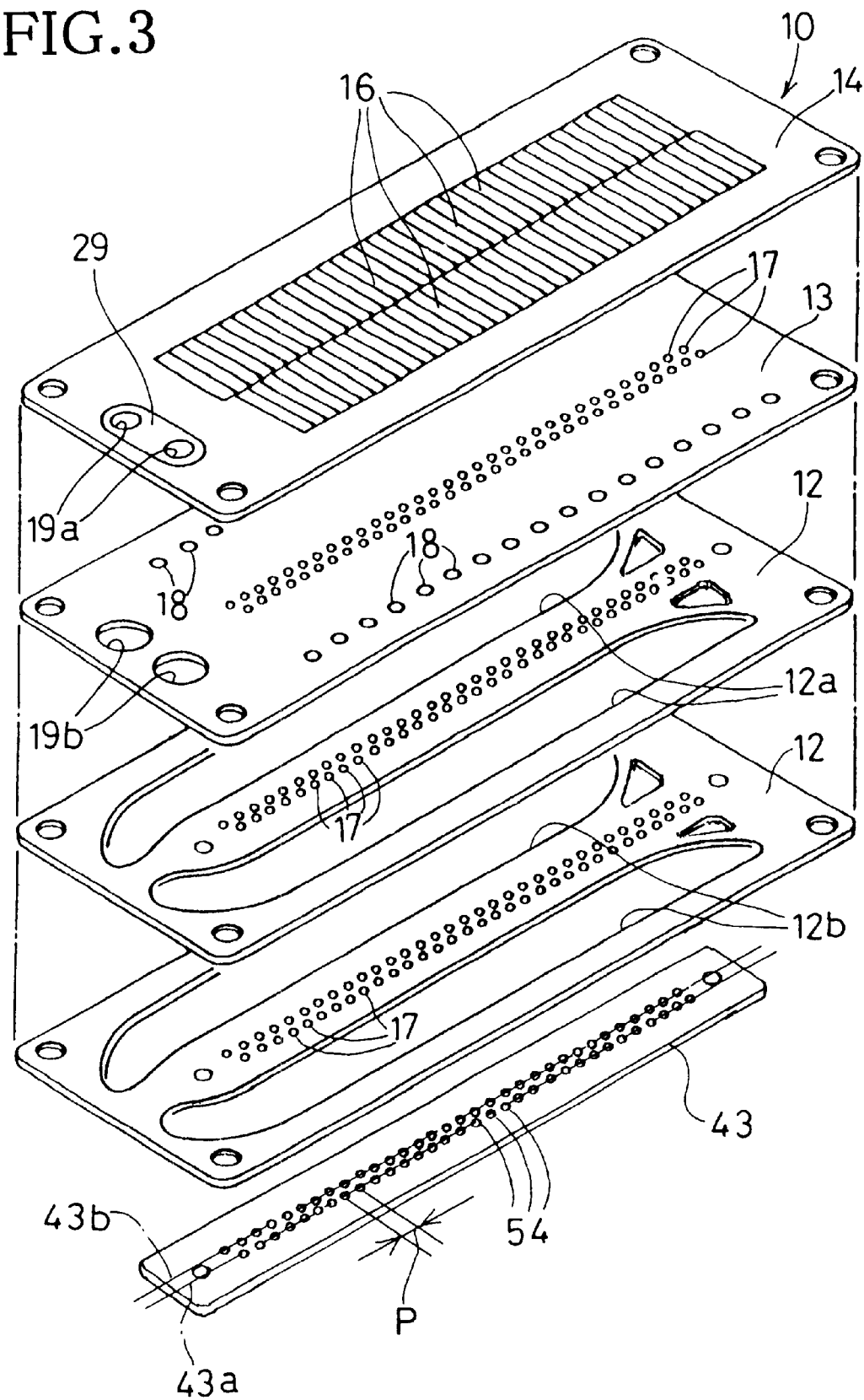
FIG. 3 is an exploded perspective view of the cavity plate.
Figure 4:
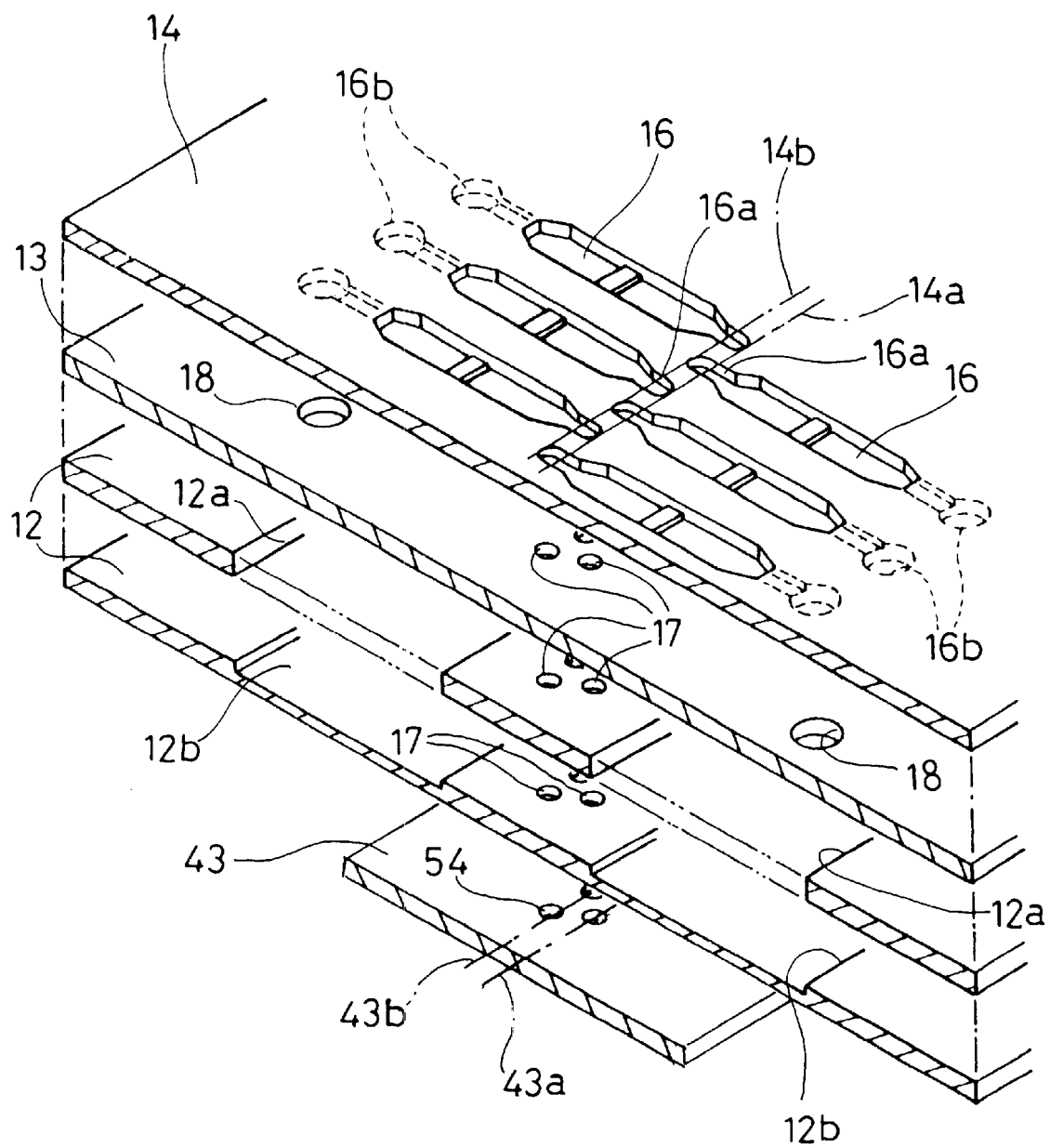
FIG. 4 is an enlarged partially perspective view of the cavity plate.

As shown in FIGS. 3 and 4, the cavity plate 10 has a laminated structure. More specifically, the cavity plate 10 includes five thin plates in total, that is, a nozzle plate 43, two manifold plates 12, a spacer plate 13, and a base plate 14, which are stacked and bonded with an adhesive. In the first embodiment, each of the plates 12, 13, 14, other than the nozzle plate 43, is a steel plate alloyed with 42% nickel, and approximately 50–150 μm in thickness. Two rows of the staggered nozzles 54, each having an extremely small diameter, are provided in the nozzle plate 43 with a fine pitch P, along reference lines 43a, 43b extending in a longitudinal direction of the nozzle plate 43, to eject ink from the nozzles 54.

Pressure chambers 16 (which will be described in detail below) associated with the nozzles 54, are disposed so as to correspond to piezoelectric active portions 35 (in FIGS. 5 and 7) of the piezoelectric actuator 20 in a laminated direction of the plates 43, 12, 13, 14. Each pressure chamber 16 is formed so as to extend in a direction perpendicular to the longitudinal direction of the nozzle plate 43 (so as to intersect the pressure chamber 16 and the longitudinal direction of the nozzle plate 43). A row of the pressure chambers 16 is provided along the longitudinal direction of the nozzle plate 43.

The upper manifold plate 12 facing the spacer plate 13 has a pair of manifold chambers 12a formed thereon as ink passages, along one side of each row of the nozzles 54. Similarly, the lower manifold plate 12 facing the nozzle plate 43 has a pair of manifold chambers 12b formed thereon, along one side of each row of the nozzles 54. The manifold chambers 12a, 12b extend so as to overlap the rows of the pressure chambers 16, as shown in FIGS. 3 and 4 when viewed from the top. The manifold chambers 12b of the lower manifold plate 12 are recessed so as to open upwardly toward the upper manifold plate 12, as best shown in FIG. 4. The manifold chambers 12a, 12b are sealed by stacking the spacer plate 13 on the upper manifold plate 12.

As shown in FIG. 4, the base plate 14 includes a plurality of the slit-like pressure chambers 16, which extend in a direction perpendicular to reference lines 14a, 14b of the base plate 14, that is, which extend along the shorter sides of the base plate 14. Ends 16a of a row of the pressure chambers 16 on the left side in FIG. 4 are located on the reference line 14a. The ends 16a of the other row of the pressure chambers 16 on the right side in FIG. 4, are located on the reference line 14b. A plurality of the pressure chambers 16 are formed on the base plate 14 in a staggered configuration, so as to locate the ends 16a of the pressure chambers 16 on the reference lines 14a and 14b alternately, as shown in FIG. 4. The pressure chambers 16 are provided so as to extend in the opposite direction every other chamber 16.

The ends 16a of the pressure chambers 16 communicate with the two rows of staggered nozzles 54 formed in the nozzle plate 43, via through holes 17, which are very small in diameter and formed, in a staggered configuration, in the spacer plate 13 and two manifold plates 12. Other ends 16b of the pressure chambers 16 communicate with the manifold chambers 12a, 12b of the manifold plates 12, via through holes 18 formed in the spacer plate 13 along the longer sides of the plate 13, as will be easily seen in FIG. 3.

As shown in FIG. 4, the other ends 16b are formed in the base plate 14 into recesses so as to open downwardly. As shown in FIG. 3, ink supply holes 19a are formed on an end of the topmost base plate 14. Provided on the ink supply holes 19a is a filter 29 that removes dust, dirt, and other contaminants included in ink supplied from an ink tank (not shown) disposed above the base plate 14. Ink supply holes 19b are formed on an end of the spacer plate 13 at positions associated with the ink supply holes 19a formed in the base plate 14.

In FIGS. 3 and 4, ink supplied from the ink tank (not shown) flows into the manifold chambers 12a, 12b through the ink supply holes 19a, 19b formed in one end of the base plate 14 and the spacer plate 13, respectively. The ink flowed into manifold chambers 12a, 12b is then distributed into the pressure chambers 16, via the through holes 18. Thereafter, the ink in the pressure chambers 16 is supplied to the corresponding nozzles 54, via the through holes 17.

Figure 5:
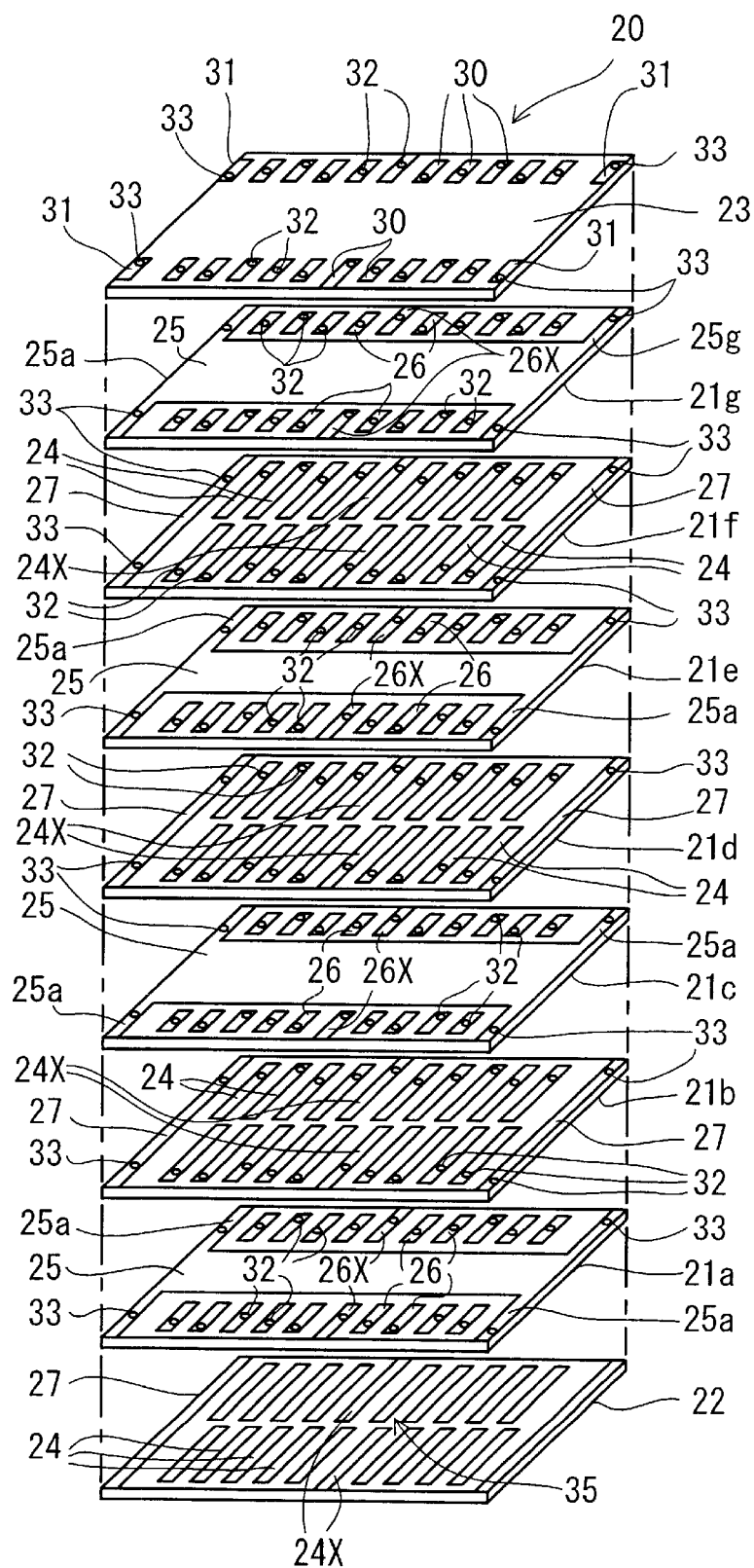
FIG. 5 is an exploded perspective view of the piezoelectric actuator.

Structures of the laminated piezoelectric actuator 20 will be described with reference to FIGS. 5 through 7. As shown in FIG. 5, the piezoelectric actuator 20 includes eight piezoelectric sheets 22, 21a, 21b, 21c, 21d, 21e, 21g, and an insulating sheet 23 that are laminated or stacked on top of each other. In the first embodiment, each of the piezoelectric sheets 21a–21g, 22 and the insulating sheet 23 is approximately 15 to approximately 40 μm in thickness. It is preferable that the same material as the piezoelectric sheets 21a–21g, 22 be used for the insulating sheet 23 for the sake of fabrication.

The piezoelectric actuator 20 is structured similar to a piezoelectric actuator disclosed in U.S. Pat. No. 5,402,159. More specifically, the narrow individual electrodes 24 are formed on a surface (larger face) of each of the odd-numbered piezoelectric sheets 22, 21b, 21d, 21f when counted from the lowermost piezoelectric sheet 22. The individual electrodes 24 are provided so as to laterally extend along the shorter side of the piezoelectric sheet 22, 21b, 21d, 21f toward a central portion thereof. A row of the individual electrodes 24 is provided parallel to the longitudinal direction of the sheet 22, 21b, 21d, 21f, along each longer side of the sheet 22, 21b, 21d, 21f. The individual electrodes 24 correspond to the pressure chambers 16 of the cavity plate 10. The width of each individual electrode 24 is set slightly smaller than the widest portion of the corresponding pressure chamber 16.

A common electrode 25 that is common to a plurality of the pressure chambers 16 is formed on a surface (larger face) of each of the even-numbered piezoelectric sheets 21a, 21c, 21e, 21g when counted from the lowermost piezoelectric sheet 22. In the piezoelectric sheets 21a–21g, piezoelectric active portions 35 that are deformed by the piezoelectric effects, are provided at portions where the individual electrodes 24 and the common electrodes 25 are overlapped in the sheet laminated direction, that is, at the portions sandwiched between the individual electrode 24 and the common electrodes 25.

The common electrode 25 is formed into a substantially rectangular shape at a substantially central portion of the even-numbered piezoelectric sheet 21a, 21c, 21e, 21g, along the longitudinal direction, so as to cover two rows of the pressure chambers 16, which are aligned in the longitudinal direction of the base plate 14. Extending portions 25a are integrally formed with the common electrode 25 and extend laterally so as to cover substantially the entire length of each shorter side end of the even-numbered piezoelectric sheet 21a, 21c, 21e, 21g.

Individual dummy electrodes 26 are formed on the even-numbered piezoelectric sheet 21a, 21c, 21e, 21g along each longer side end thereof, at portions other than the piezoelectric active portions 35 (i.e., at the portions where the common electrode 25 is not formed). The individual dummy electrode 26 has substantially the same width as the individual electrode 24 but has a shorter length than the individual electrode 24. The individual dummy electrodes 26 are formed so as to correspond to the individual electrodes 24 (in the substantially same vertical positions). The individual dummy electrodes 26 do not contribute to deformation of the piezoelectric actuator 20, but reduce variations in thickness when the piezoelectric sheets 22, 21a–21g and the insulating sheet 23 are laminated.

Dummy common electrodes 27 are formed on each of the odd-numbered piezoelectric sheets 22, 21b, 21d, 21f at positions corresponding to the extending portions 25a (in the substantially same vertical positions). As will be described in detail below, the electrodes 24, 25, 26, 27 of the first embodiment are formed of electrically conductive Ag—Pd (silver-palladium)-based paste that includes approximately 30% of Pd (palladium) as a conductive material.

Surface electrodes 30 corresponding to the individual electrodes 24 and surface electrodes 31 corresponding to the extending portions 25a of the common electrodes 25 are formed on a surface of the topmost insulating sheet 23, which is also the piezoelectric sheet, along each longer side end of the insulating sheet 23. In the first embodiment, the surface electrodes 30, 31 are formed of, for example, Ag-based material of which Ag is a main ingredient of the electrically conductive Ag—Pd-based paste forming the electrodes 24, 25, 26, 27. The Ag-based material may include a very small quantity of Pd. The surface electrodes 30, 31 are about 7 to about 17 μm in thickness (in the laminated vertical direction).

Through holes 32 are formed on the piezoelectric sheets 21a–21g and the insulating sheet 23, other than the lowermost piezoelectric sheet 22, that electrically interconnect the surface electrodes 30 and the corresponding individual electrodes 24 and the individual dummy electrodes 26. Similarly, formed on the piezoelectric sheets 21a–21g and the insulating sheet 23 are a through hole 33 that electrically interconnect at least one surface electrode 31 (four surface electrodes 31, one on each corner of the insulating sheet 23 in the first embodiment) and the corresponding extending portions 25a and the dummy common electrodes 27. The electrically conductive material used for the individual electrodes 24 and the common electrodes 25, that is, the electrically conductive Ag—Pd-based paste is applied to the through holes 32, 33.

An end of the individual electrodes 24 and the individual dummy electrodes 26 is not extended to an edge of the piezoelectric sheets 21a–21g, 22 so as to be exposed on side faces of the sheets 21a–21g, 22, in order to electrically interconnect the corresponding individual electrodes 24 formed on the odd-numbered piezoelectric sheet 22, 21b, 21d, 21f, though some individual electrodes 24 and individual dummy electrodes 26, as will be described below, are extended to an edge of the sheet 21a–21g, 22 in order to identify the positions of the individual electrodes 24 and the individual dummy electrodes 26. Instead, the corresponding individual electrodes 24 of the odd-numbered sheet 22, 21b, 21d, 21f are electrically interconnected by the through holes 32 and the electrically conductive material applied to the through holes 32. Therefore, the individual electrodes 24 do not have to be extended to the edge of the piezoelectric sheets 21a–21g, 22.

However, if none of the individual electrodes 24 nor the individual dummy electrodes 26 are extended to an edge of each of the piezoelectric sheets 21a–21g, 22, so as to be exposed to the side faces of the piezoelectric sheets 21a–21g, 22, positions of the individual electrodes 24 are not identified from the outside as the piezoelectric sheets 21a–21g, 22 are laminated. To prevent such situations, an extended individual electrode 24X and an extended individual dummy electrode 26X are provided, as identification marks for the internal electrodes, in the middle of each row of the individual electrodes 24 and the individual dummy electrodes 26 formed on the relevant piezoelectric sheets 21a–21g, 22. The extended individual electrodes 24X and the extended individual dummy electrodes 26X are extended to an edge of the relevant piezoelectric sheets 21a–21g, 22, so as to be exposed to the side faces of the sheets 21a–21g, 22.

The extended individual electrodes 24X (and the extended individual dummy electrodes 26X) are provided in the middle of each row of the individual electrodes 24 and the individual dummy electrodes 26, as described above, for the following reasons. The piezoelectric actuator 20 is fabricated by laminating and sintering the piezoelectric sheets 22, 21a–21g, and the insulating sheet 23, as will be described in detail below. During the sintering process, those sheets 22, 21a–21g, 23 shrink and the amount of the shrinkage may slightly vary according to the piezoelectric actuators 20 to be produced. In addition, pitches of the individual electrodes 24 do not match pitches of the pressure chambers 16 of the cavity plate 10 exactly. When the piezoelectric actuator 20 and the cavity plate 10 are assembled together, with reference to a side marked face 24Xa (in FIGS. 1 and 2B) created by the extended individual electrodes 24X (and the extended individual dummy electrode 26X), the positional errors at opposite ends of the insulating sheet 23 in the longitudinal direction between the surface electrode 31 and corresponding pressure chamber 16 are minimized.

The surface electrodes 30 associated with the extended individual electrodes 24X are also extended to the edges of the insulating sheet 23 so as to be exposed on the side faces of the sheet 23. The through holes 32, 33 formed in the piezoelectric sheets 21a–21g and the insulating sheet 23 will be described below.

As shown in FIGS. 5 and 6, the through holes 32, 33 are formed in the piezoelectric sheets 21a–21g and the insulating sheet 23 in a staggered arrangement, so as to prevent the through holes 32, 33 from aligning along the longitudinal direction of the sheets 21a–21g, 23, parallel to the rows of the individual electrodes 24 (or the individual dummy electrodes 26).

More specifically, as shown in FIG. 6, the through holes 32, 33 are provided in the insulating sheet 23 at L1, L2, or L3 distance from an edge of the longer side of the insulating sheet 23 and in the order of L1, L2, and L3 from one shorter side end of the insulating sheet 23. The through holes 32, 33 formed in the piezoelectric sheets 21a–21g laminated under the insulating sheet 23 communicate with the corresponding through holes 32, 33 formed in the insulating sheet 23. In other words, the through holes 32, 33 formed in the piezoelectric sheets 21a–21g are provided at L1, L2, or L3 distance from an edge of the longer side of the sheets 21a–21g and in the order of L1, L2, and L3 from one shorter side end of the sheets 21a–21g.

Arrangements of the through holes 32, 33 formed in the piezoelectric sheets 21a–21g and the insulating sheet 23 are not limited to the above-described arrangement. Other arrangements may be employed such that the adjacent through holes 32, 33 in the longitudinal direction of the sheets 21a–21g, 23 are not aligned along the longer side of the sheets 21a–21g, 23.

Figure 9A:
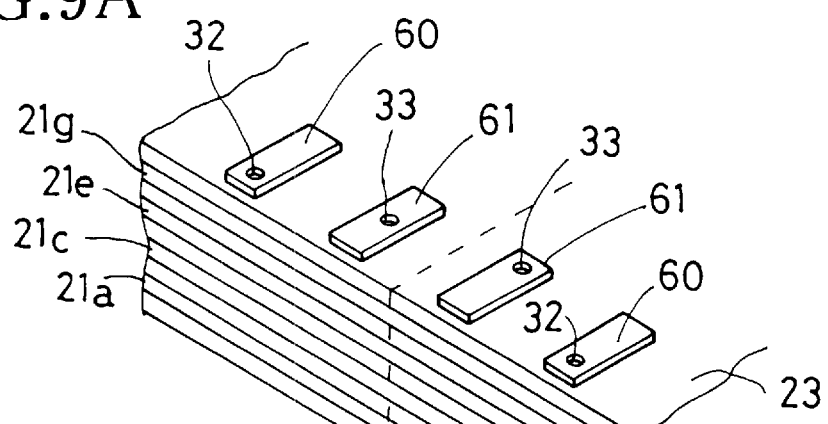
FIG. 9A is a partially perspective view of the piezoelectric actuator, showing one of manufacturing processes thereof, wherein the piezoelectric actuator is in a condition before being subjected to firing.
Figure 9B:
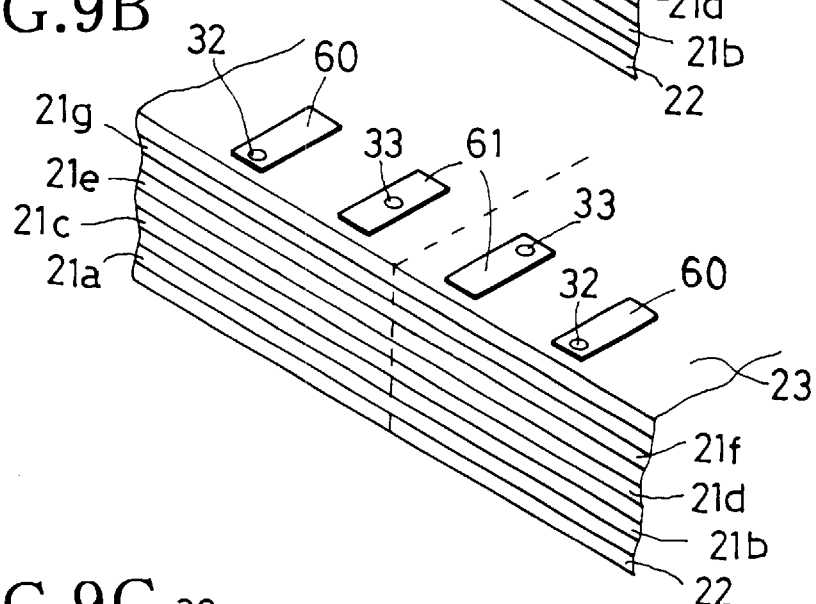
FIG. 9B is a partially perspective view of the piezoelectric actuator, showing one of manufacturing processes thereof, wherein the piezoelectric actuator is in a condition after being subjected to firing.

A method of the manufacture of the piezoelectric actuator 20 will described with reference to FIGS. 9A to 9C. A base sheet (green sheet) whose size covers a plurality of the piezoelectric sheets 21b (21d, 21f, or 22) arranged in a matrix, is prepared. The through holes 32, 33 are formed on a surface of the base sheet at positions where a plurality of the individual electrodes 24 and the dummy common electrodes 27 are to be formed in the piezoelectric sheets 21b (21d, 21f) to be produced. Thus, a first base sheet for the piezoelectric sheet 22 and the first base sheet for the piezoelectric sheets 21b (21d, 21f) for having through holes 32, 33 at appropriate positions are formed.

Similarly, the base sheet (green sheet) whose size covers a plurality of the piezoelectric sheets 21a (21c, 21e, or 21g) arranged in a matrix, is prepared. The through holes 32, 33 are formed on a surface of the base sheet at positions where a plurality of the extending portions 25a of the common electrodes 25 and the individual dummy electrodes 26 are to be formed in the piezoelectric sheets 21a (21c, 21e, 21g) to be produced. Thus, a second base sheet for the piezoelectric sheets 21a (21c, 21e, 21g) having through holes 32, 33 at appropriate positions are formed.

Further, the base sheet (green sheet) whose size covers a plurality of the insulating sheets 23 arranged in a matrix, is prepared. The through holes 32, 33 are formed on a surface of the base sheet at positions where a plurality of the surface electrodes 30, 31 are to be formed in the insulating sheets 23 to be produced. Thus, a third base sheet for the insulating sheets 23 having through holes 32, 33 at appropriate positions are formed.

Thereafter, the electrically conductive Ag—Pd-based paste is applied by screen printing to the surface of the piezoelectric sheet 21b (21d, 21f, 22) in order to form the individual electrodes 24 and the dummy common electrodes 27 thereon, and to the surface of the piezoelectric sheet 21a (21c, 21e, 21g) in order to form the common electrodes 25 and the individual dummy electrodes 26 thereon. Electrically conductive Ag—Pd-based paste is applied by screen printing to the surface of the insulating sheet 23 in order to form tabs 60, 61 (in FIG. 9A) at positions where the surface electrodes 30, 31 are to be formed (where the through holes 32, 33 are formed).

The through holes 32, 33 are formed in the first to third base sheets, passing through from an upper surface to a lower surface thereof. When the electrically conductive paste is applied by screen printing, the paste enters into the through holes 32, 33. As the first to the third base sheets are laminated, the upper and lower surfaces of the laminate are electrically connected by the electrodes 24–27 and the tabs 60, 61, via the through holes 32, 33.

In the first embodiment, the area of each tab 60, 61 after fired is set to be about a half ($\frac{1}{2}$) of the area of the corresponding surface electrode 30, 31 or greater, but up to the equal size of the area of the corresponding surface electrode 30, 31.

The base sheets are laminated after being dried. The base sheets are pressed in the laminated direction, to form a single laminate (FIG. 9A). The laminate is sintered or fired at approximately 1100° C. The tabs 60, 61 formed on the insulating sheet 23 shrink due to the heat applied during firing, as shown in FIG. 9B. The area of each of the tabs 60, 61 is reduced to be about a half ($\frac{1}{2}$) of the area of the corresponding surface electrode 30, 31 or greater, but up to the equal size of the area of the corresponding surface electrode 30, 31.

Figure 9C:
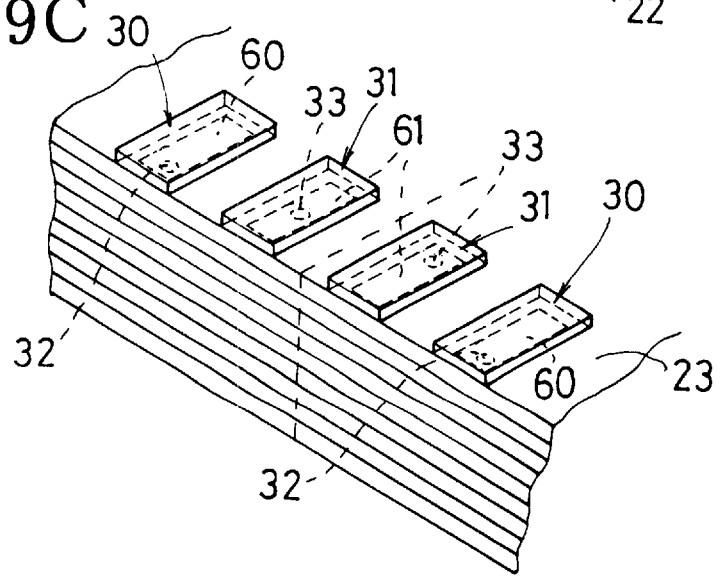
FIG. 9C is a partially perspective view of the piezoelectric actuator, showing one of manufacturing processes thereof, wherein surface electrodes are baked.

As shown in FIG. 9C, the Ag-based material is applied by the screen printing to the tabs 60, 61, which have become thin (approximately 1 $\mu$m in the first embodiment), in order to form the surface electrodes 30, 31. Then, the surface electrodes 30, 31 are baked at approximately 600° C. Thereafter, the laminate is cut into a predetermined size, to produce the piezoelectric actuators 20.

In the thus laminated piezoelectric sheets 22, 21a–21g, and the insulating sheet 23 in the vertical direction, the individual electrodes 24, the individual dummy electrodes 26, and the surface electrodes 30 associated with each other are electrically connected through the electrically conductive material applied to the through holes 32, as shown in FIG. 7. Similarly, the extending portions 25a of the common electrodes 25, the dummy common electrodes 27, and the surface electrodes 31 associated with each other are electrically connected through the electrically conductive material applied to the through holes 33.

In the first embodiment, the tabs 60, 61 formed by printing on the insulating sheet 23 with the electrically conductive Ag—Pd-based paste is fired at a high temperature (approximately 1100° C. in the first embodiment), so that the tabs 60, 61 are tightly adhered onto the insulating sheet 23. The surface electrodes 30, 31 formed with the Ag-based material are bonded to the tabs 60, 61 that are formed with the electrically conductive Ag—Pd-based paste, by baking at a lower temperature (approximately 600° C. in the first embodiment). Thus, metals including the same type of the main ingredient (i.e., Ag in the first embodiment) are bonded to each other, so that the bonding strength of the surface electrodes 30, 31 to the tabs 60, 61 can be increased.

Even though the surface electrodes 30, 31 are not fired at high temperatures, the surface electrodes 30, 31 are bonded to the insulating sheet 23 with a sufficient strength by the tabs 60, 61 serving as binders. Therefore, for example, when the surface electrodes 30, 31 are soldered to the flexible printed cable 40, the surface electrodes 30, 31 are prevented from peeling off the insulating sheet 23, resulting in the reduction of such defects.

The area of the tabs 60, 61 after being fired at a high temperature is about a half ($\frac{1}{2}$) of the area of the corresponding surface electrode 30, 31 or greater, but does not exceed the size equal to the area of the corresponding surface electrode 30, 31. With this structure, the areas of the surface electrodes 30, 31 contacting to the internal electrodes are increased when compared with a conventional structure such that the surface electrodes are electrically connected through the electrically conductive paste applied to the through holes. Therefore, sufficient bonding strength between the surface electrodes 30, 31 and the insulating sheet 23 is ensured, and the surface electrodes 30, 31 and the associated individual electrodes 24 and the common electrodes 25 are reliably electrically connected. Consequently, defects, such as poor contact, are remarkably reduced.

With the above-described method of manufacture, a reliable piezoelectric actuator 20 is manufactured. When the laminate is cut into blocks according to the size of piezoelectric actuator 20 after being sintered, the extended individual electrodes 24X and the extended individual dummy electrodes 26X are exposed or identified on the laminated side face.

Figure 2A:
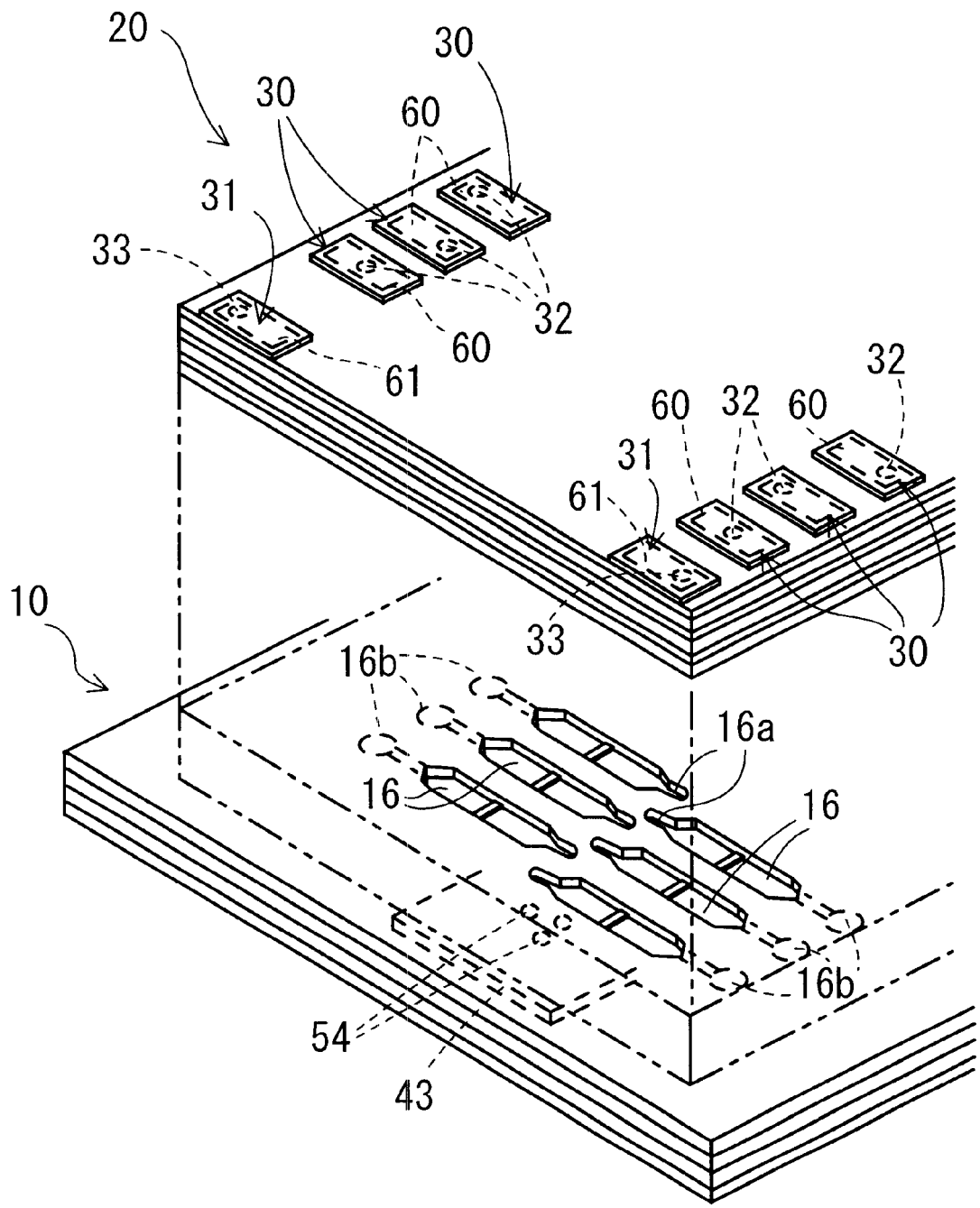
FIG. 2A is an enlarged partially perspective view of a piezoelectric actuator and a cavity plate showing one end of each of the piezoelectric actuator and the cavity plate.
Figure 2B:
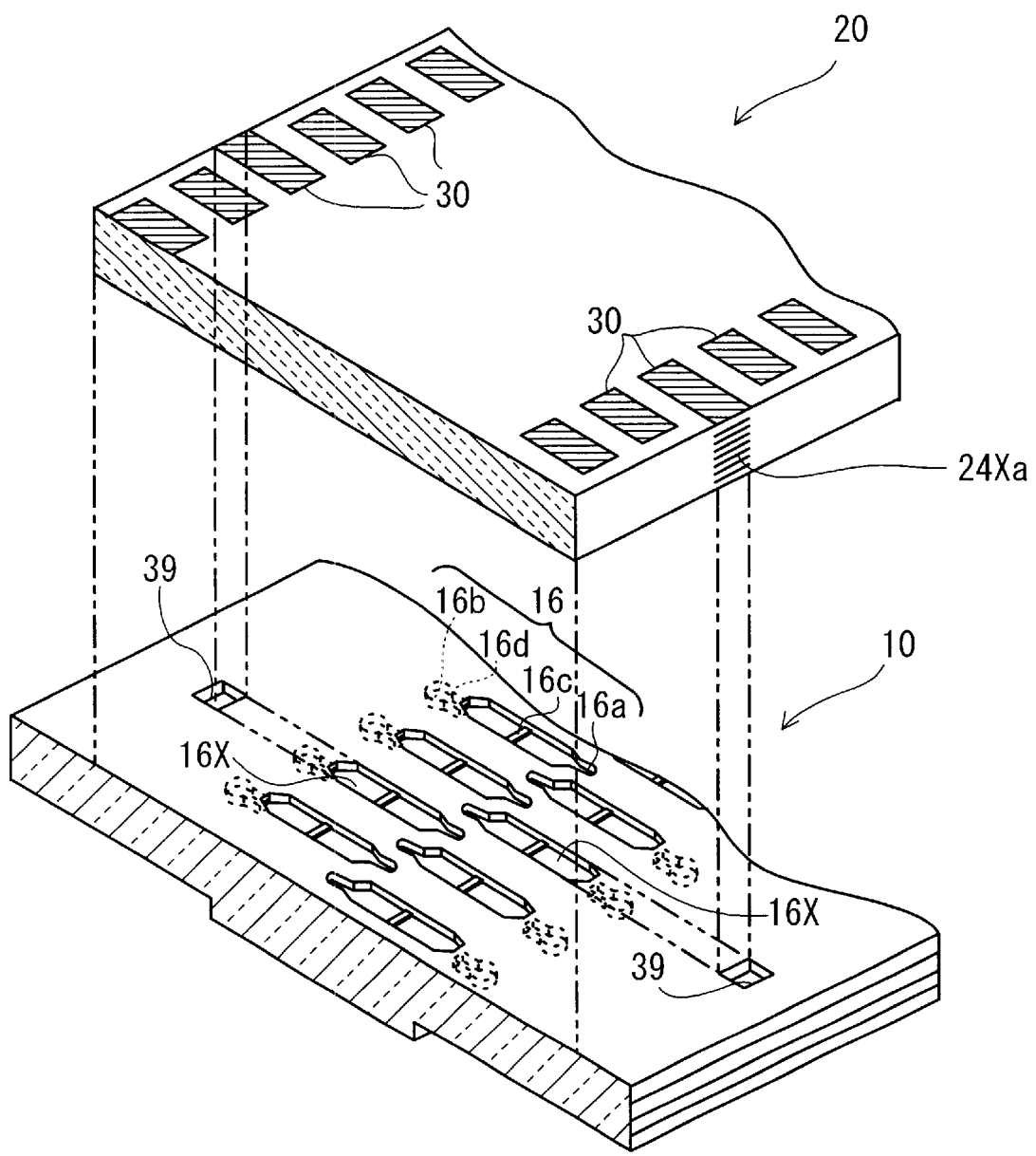
FIG. 2B is an enlarged partially perspective view of the piezoelectric actuator and the cavity plate showing a central portion of each of the piezoelectric actuator and the cavity plate.

A method of bonding the piezoelectric actuator 20 to the cavity plate 10 above will be described below, with reference to FIGS. 1, 2B and 8. As shown in FIG. 8, an adhesive sheet 41, as an adhesive layer, that is made of synthetic resin and does not penetrate ink, is attached to a lower side surface of the piezoelectric actuator 20 (larger surface that faces the pressure chamber 16 of the cavity plate 10). Then, the piezoelectric actuator 20 is fixedly attached to the cavity plate 20, such that the individual electrodes 24 of the actuator 20 correspond to the respective pressure chambers 16 of the cavity plate 10, using a mark 39 and the side marked face 24Xa, as shown in FIGS. 1 and 2B.

The mark 39 is provided for a pressure chamber 16X corresponding to the extended individual electrode 24X, on the surface of the cavity plate 10 to which the piezoelectric actuator 20 is attached. The mark 39 is aligned with the side marked face 24Xa created by the extended individual electrodes 24X. The mark 39 and the side marked face 24Xa are used, as fabrication marks, to adhere the piezoelectric actuator 20 to the cavity plate 10. Thus, the individual electrodes 24 are properly disposed on the corresponding pressure chambers 16.

Printed patterns (not shown) on the flexible printed cable 40 are electrically connected to the surface electrodes 30, 31 by pressing the flexible printed cable 40 onto the upper surface of the piezoelectric actuator 20. The surface electrodes 30, 31 are not fired at a high temperature, so that the surface electrodes 30, 31 are less subjected to oxidation. In addition, the electrodes 30, 31 are thicker than the tabs 60, 61 (about 7 to about 17 $\mu$m in the first embodiment), so that sufficient bonding strength can be ensured when the surface electrodes 30, 31 are soldered to the flexible printed cable 40.

The adhesive sheet 41 is made of, for example, a non-ink-penetrating and electrical insulating material, such as a film-like polyamide-based hot melt adhesive including a nylon-based or dimer-acid-based polyamide resin as a main ingredient, a film-like polyester-based hot melt adhesive, and a fluid polyolefin-based hot melt adhesive. The adhesive layer is approximately 1 $\mu$m in thickness.

A voltage, which is higher than a voltage applied during the normal usage, is applied between all of the individual electrodes 24 and the common electrodes 25 to polarize the portions sandwiched between the electrodes 24, 25 of the piezoelectric sheets 21a–21g. When a voltage is applied between any of the individual electrodes 24 and the common electrodes 25 of the piezoelectric actuator 20, the piezoelectric active portions 35 of the piezoelectric sheets 21a–21g associated with the individual electrodes 24 to which the voltage is applied, deform in the sheet laminated direction due to the piezoelectric effects. Such deformation causes a volumetric capacity of the corresponding pressure chambers 16 to be reduced. Accordingly, ink in the pressure chamber 16 is ejected from the nozzles 54 in the form of droplets to perform printing.

In the first embodiment, the through holes 32, 33 are formed on the piezoelectric sheets 21a–21g and the insulating sheet 23 so as to prevent the through holes 32, 33 from aligning near the longer side edges of the sheets 21a–21g, 23, along the longitudinal direction. The through holes 32, 33 are aligned vertically so as to communicate vertically from the topmost layer to the lowermost layer of the piezoelectric actuator 20 and are zigzagged when viewed from the top.

However, because the through holes 32, 33 are provided in a staggered, or zigzagged configuration, when viewed from the top, stresses in the piezoelectric actuator 20 caused by the shrinkage during the firing process are dispersed. Thus, the amount of deformation to the openings of the through holes 32, 33, when viewed from the lateral direction of the piezoelectric actuator 20, is reduced.

Accordingly, when the piezoelectric actuator 20 is fixedly attached to the surface of the cavity plate 10, no gap (space) between adhesive surfaces of the actuator 20 and the cavity plate 10 is created. Therefore, problems such as ink leakage can be prevented when the piezoelectric actuator 20 and the cavity plate 10 are bonded together and assembled into an ink-jet print head.

Further, when the piezoelectric actuator 20 is fixedly attached to the surface of the cavity plate 10, the amount of pressure that is applied to attach the larger surfaces of the actuator 20 and the cavity plate 10 surface can be reduced. Accordingly, damage to the piezoelectric actuator 20 can be prevented.

Figure 10:
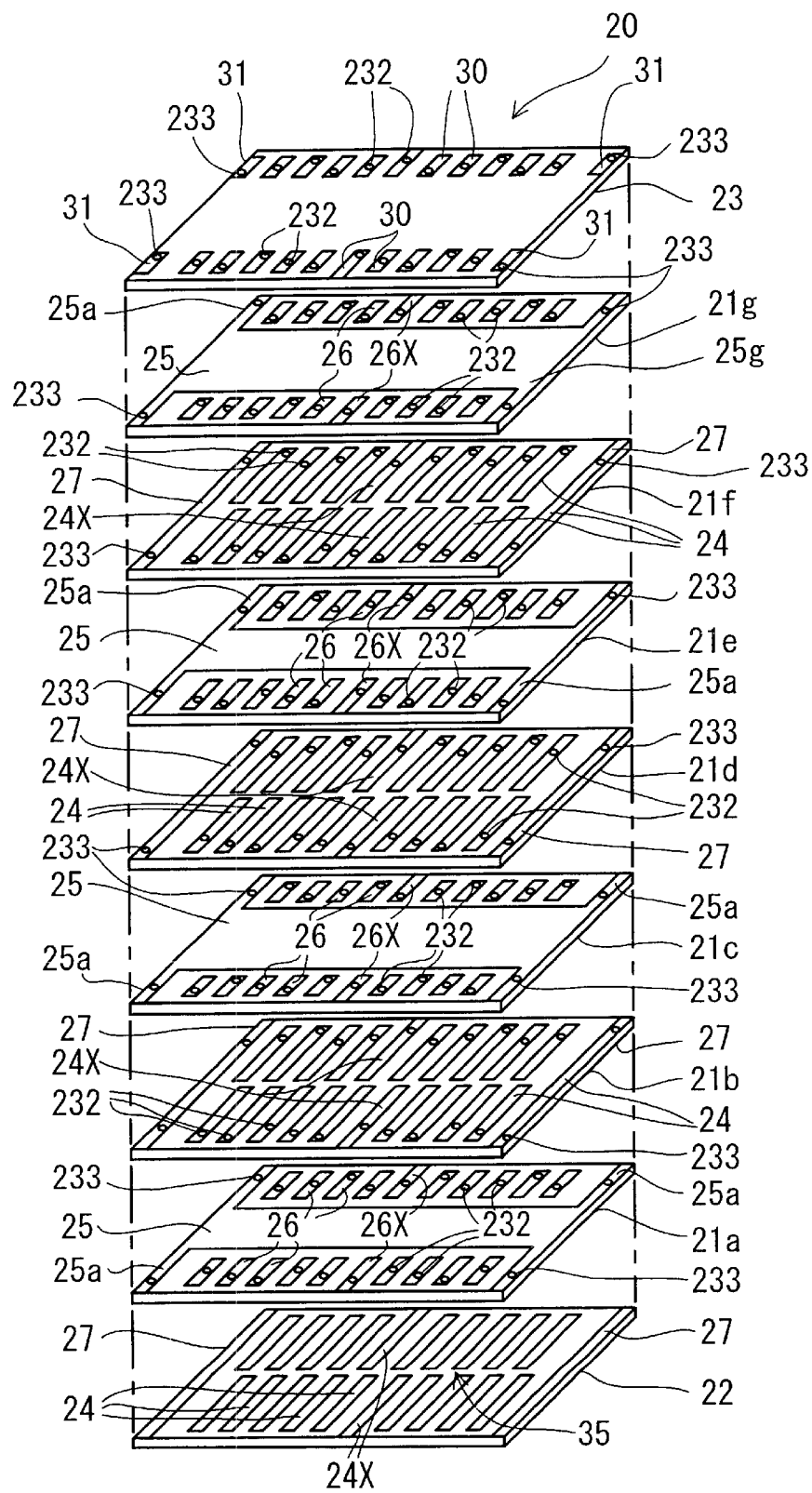
FIG. 10 is an exploded perspective view of a piezoelectric actuator according to a second embodiment of the invention.

Arrangements of through holes according to a second embodiment will be described with reference to FIGS. 10 to 12. Formed on the piezoelectric sheets 21a–21g and the insulating sheet 23, other than the lowermost piezoelectric sheet 22 are through holes 232 that electrically interconnect the surface electrodes 30 and the corresponding individual electrodes 24 and the individual dummy electrodes 26.

Similarly, formed on the piezoelectric sheets 21a–21g and the insulating sheet 23 are through holes 233 that electrically interconnect at least one surface electrode 31 (four surface electrodes 31, one on each corner of the insulating sheet 23 in the second embodiment) and the corresponding extending portions 25a and the dummy common electrodes 27. The electrically conductive material used for the individual electrodes 24 and the common electrodes 25, that is, the electrically conductive Ag—Pd-based paste is applied to the through holes 232, 233. Similar to the first embodiment, electrically conductive Ag—Pd-based paste is applied by screen printing to form tabs (not shown in FIGS. 10 to 12) on the surface of the insulating sheet 23 where the surface electrodes 30, 31 are to be formed (the through holes 232, 233 are formed).

Figure 11:
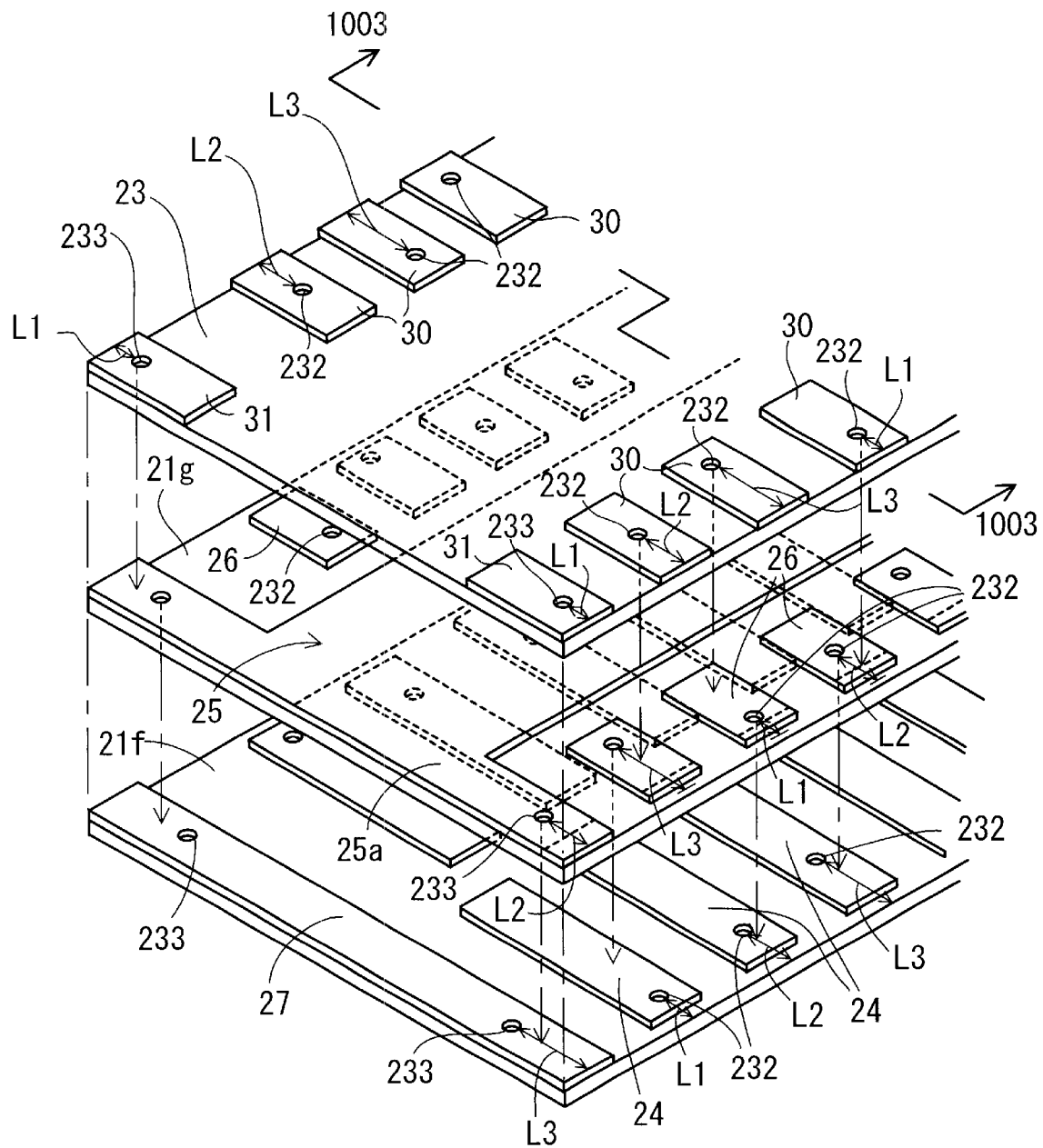
FIG. 11 is an enlarged expanded partially perspective view of the piezoelectric actuator.
Figure 12:
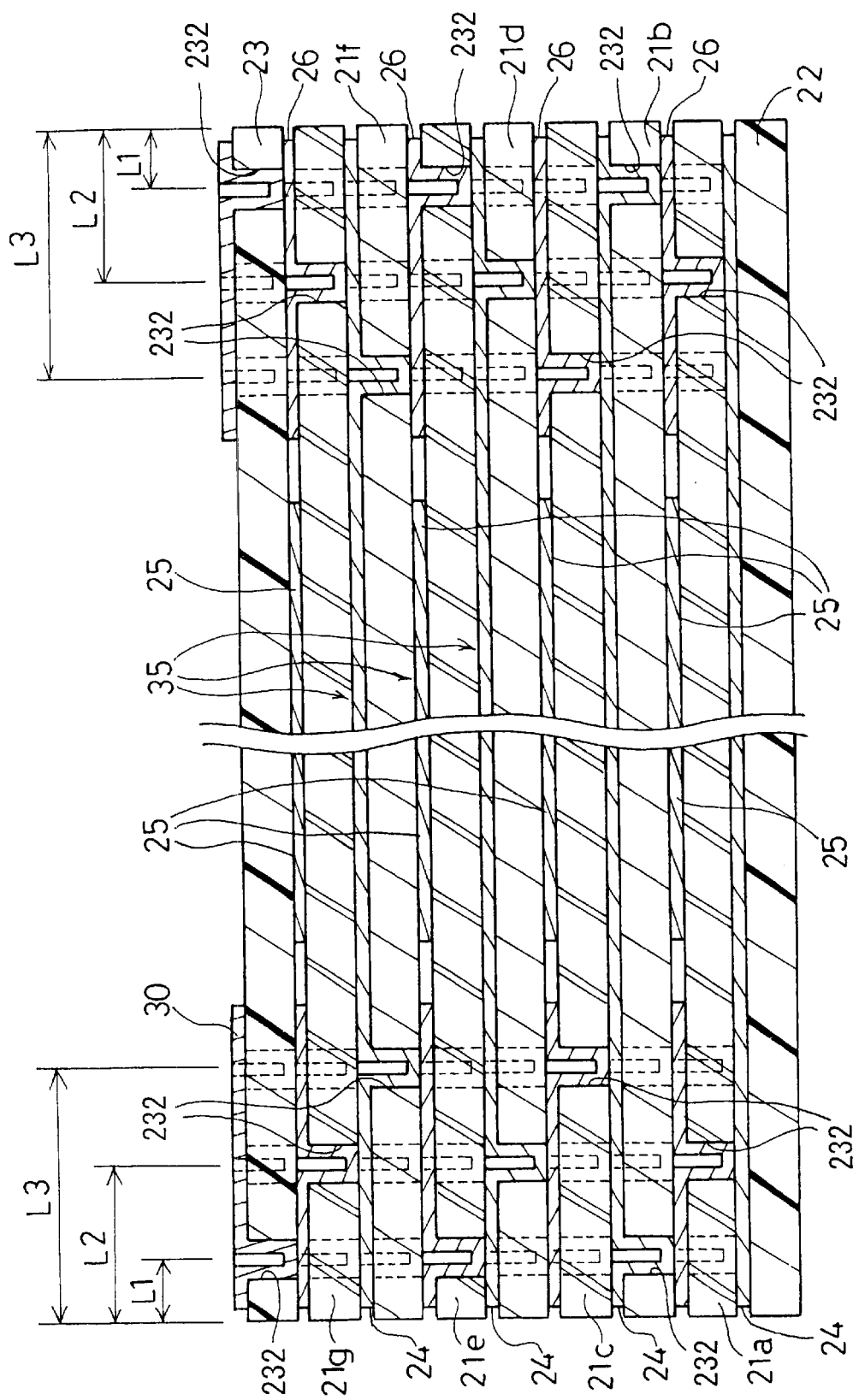
FIG. 12 is a cross sectional view of the piezoelectric actuator, taken along 1003—1003 of FIG. 11.

In the second embodiment, the through holes 232, 233 formed in the insulating sheet 23 are provided in a staggered arrangement, as shown in FIG. 11. More specifically, the through holes 232, 233 are provided in the insulating sheet 23 at L1, L2, or L3 distance from an edge of the longer side of the insulating sheet 23 and in the order of L1, L2, and L3 from one shorter side end of the insulating sheet 23. In one layer below the insulating sheet 23, that is, in the piezoelectric sheet 21g, the through holes 232, 233 are provided at L2, L3, or L1 distance from an edge of the longer side of the piezoelectric sheet 21g and in the identified order of L2, L3, and L1 from one shorter side end of the piezoelectric sheet 21g.

The through holes 232, 233 in the piezoelectric sheet 21f, which is one layer below the piezoelectric sheet 21g, are provided at L3, L1, or L2 distance from an edge of the longer side of the piezoelectric sheet 21f and in the identified order of L3, L1, and L2 from one shorter side end of the piezoelectric sheet 21f. The through holes 232, 233 are provided in the other piezoelectric sheet 21b–21e in accordance with the above-described manner.

In the second embodiment, the through holes 232, 233 are not aligned along the longitudinal direction of the piezoelectric sheets 21b–21g and the insulating sheet 23 (parallel to the aligning or lining-up direction of the individual electrodes 24 or the individual dummy electrodes 26). Further, the through holes 232, 233 are provided so as to prevent the adjacent through holes 232, 233 in the sheet laminated direction from being aligned vertically, as shown in FIG. 12.

The through holes 232 to electrically connect the adjacent individual electrodes 24 in the sheet laminate direction are provided within areas where the associated individual electrode 24, the individual dummy electrode 26, and the surface electrode 30 overlap when viewed from the top. Similarly, the through holes 233 to electrically connect the adjacent common electrodes 25 in the sheet laminate direction are provided within areas where the associated extending portion 25a of the common electrode 25, the dummy common electrode 27, and the surface electrode 31 overlap when viewed from the top.

The electrically conductive material applied to the through holes 232, 233 contact to surfaces of the electrodes of one layer below. Thus, the associated individual electrode 24, the individual dummy electrode 26, and the surface electrode 30, and the associated extending portion 25a of the common electrode 25, the dummy common electrode 27, and the surface electrode 31 are electrically interconnected, similar to the first embodiment.

The through holes 232, 233 are not aligned along the longitudinal direction of the piezoelectric sheets 21b–21g and the insulating sheet 23 and the adjacent through holes 232, 233 in the sheet laminated direction are not aligned. With this structure, stresses in the piezoelectric actuator 20 caused by the shrinkage during the firing process are more dispersed in comparison with the first embodiment. Thus, the amount of deformation in the piezoelectric actuator 20 according to the second embodiment becomes less than that in the actuator 20 according to the first embodiment. Therefore, the accuracy of flatness in the piezoelectric actuator 20 is improved.

Figure 13:
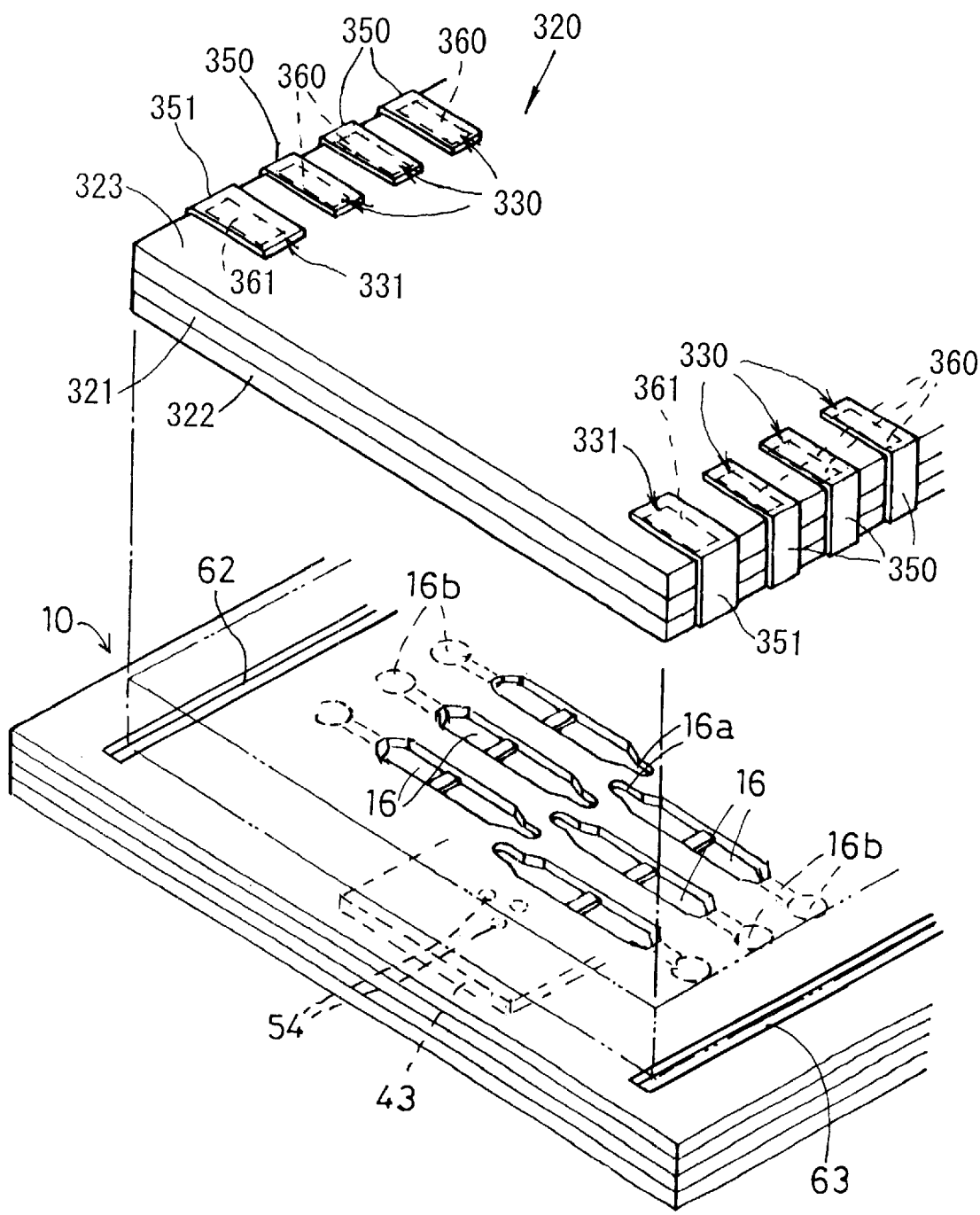
FIG. 13 is an enlarged partially perspective view of a piezoelectric actuator and a cavity plate according to a third embodiment of the invention, showing one end of each of the piezoelectric actuator and the cavity plate.
Figure 14:
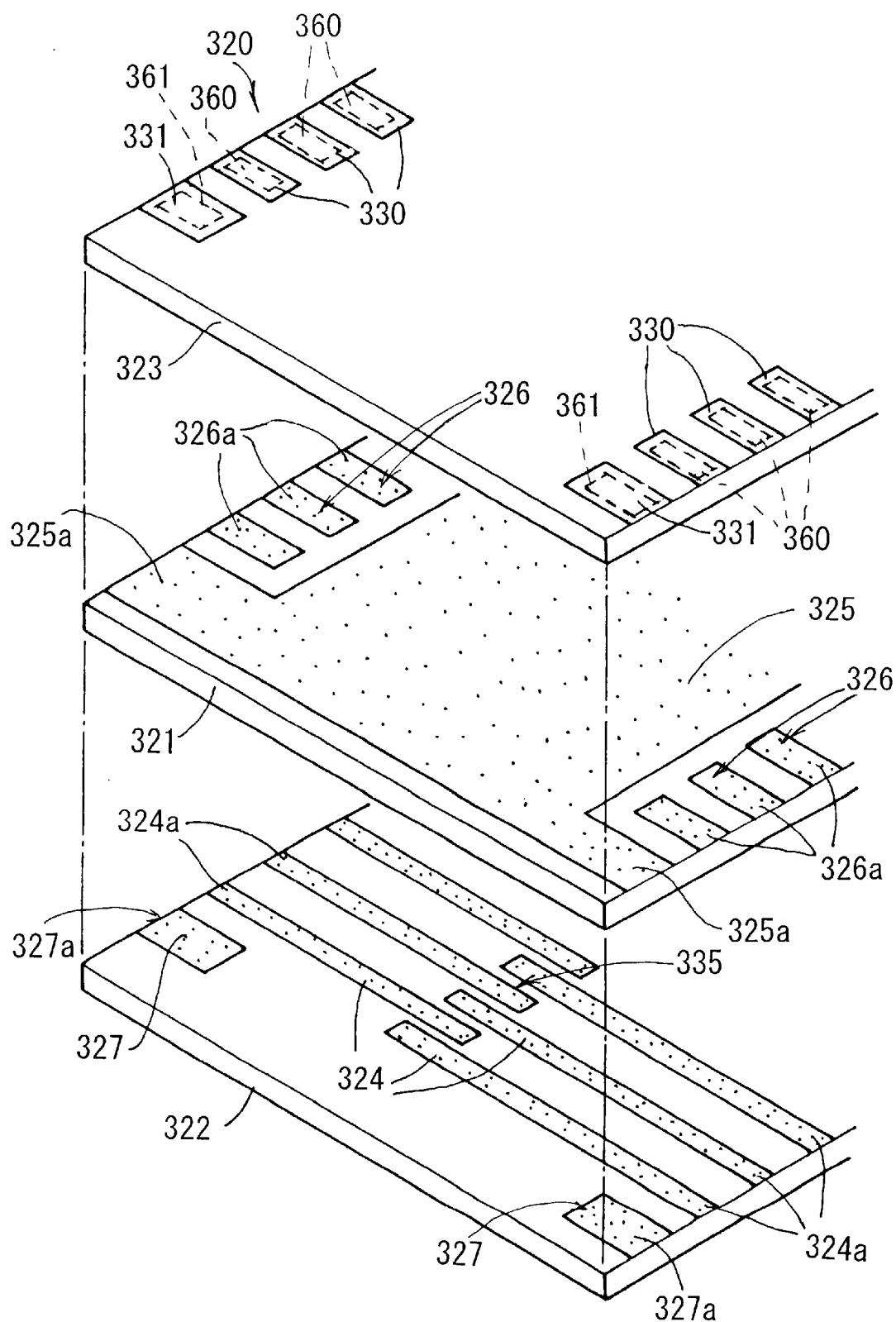
FIG. 14 is an exploded partially perspective view of the piezoelectric actuator.
Figure 15:
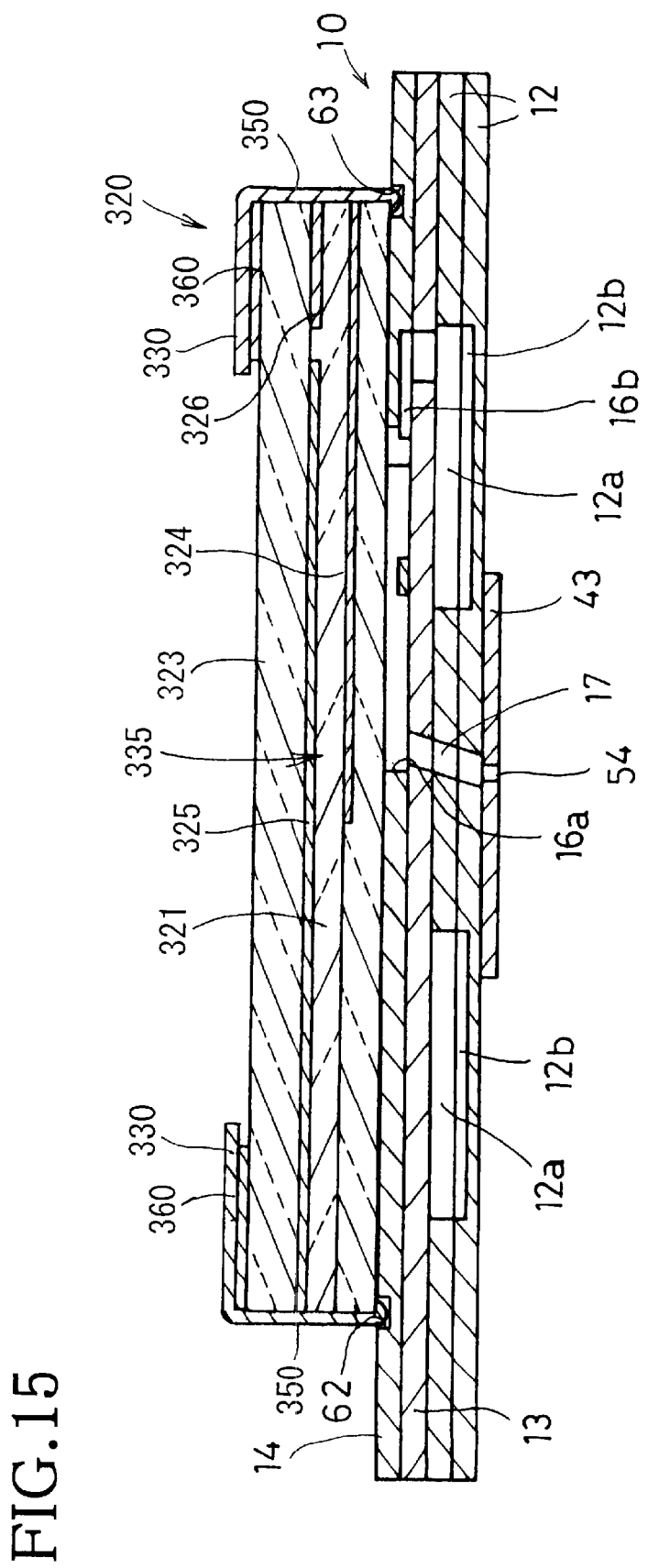
FIG. 15 is an enlarged sectional view of the flexible printed cable, the cavity plate, and the piezoelectric actuator that are laminated.
Figure 17:
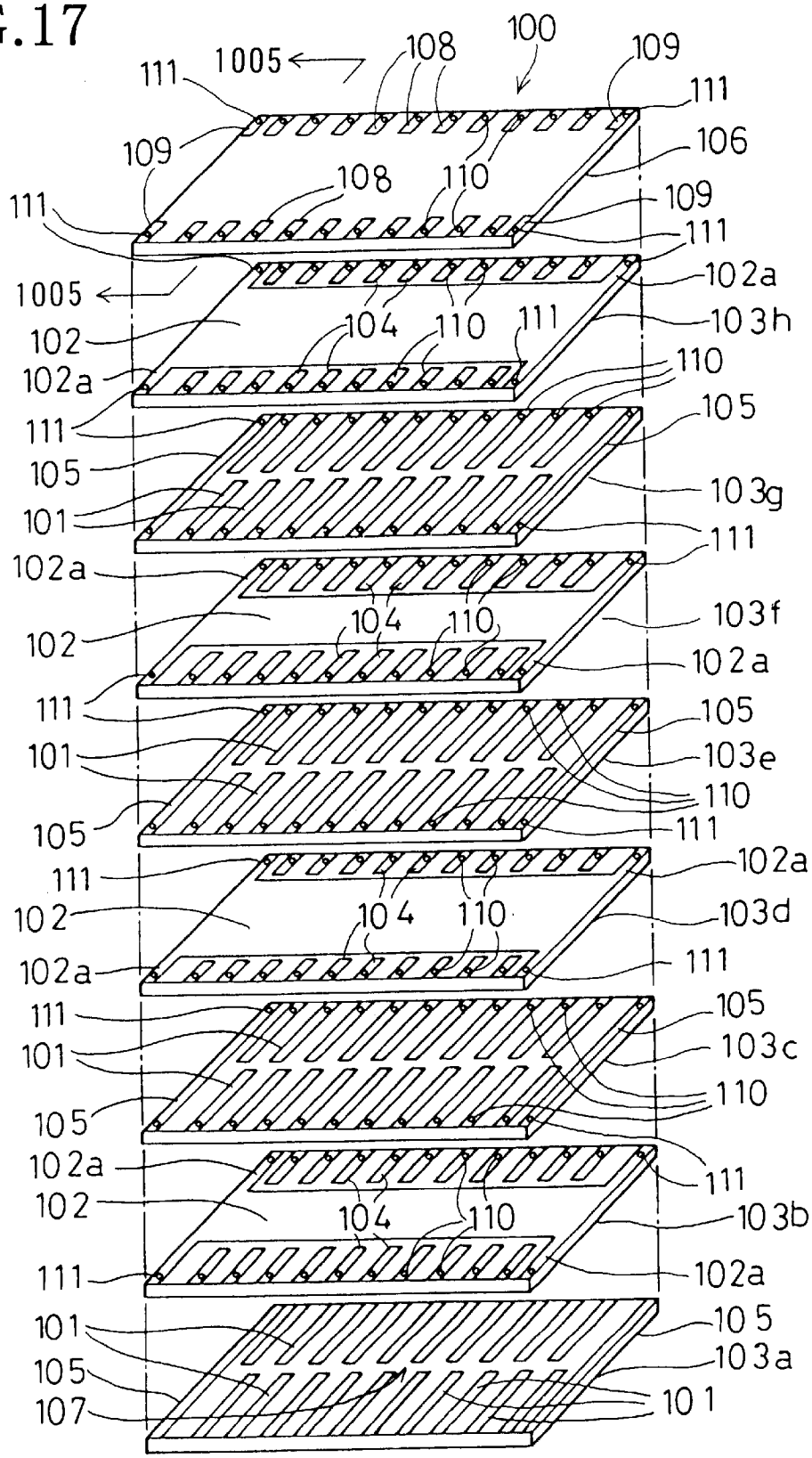
FIG. 17 is an exploded perspective view of a known piezoelectric actuator.
Figure 18:
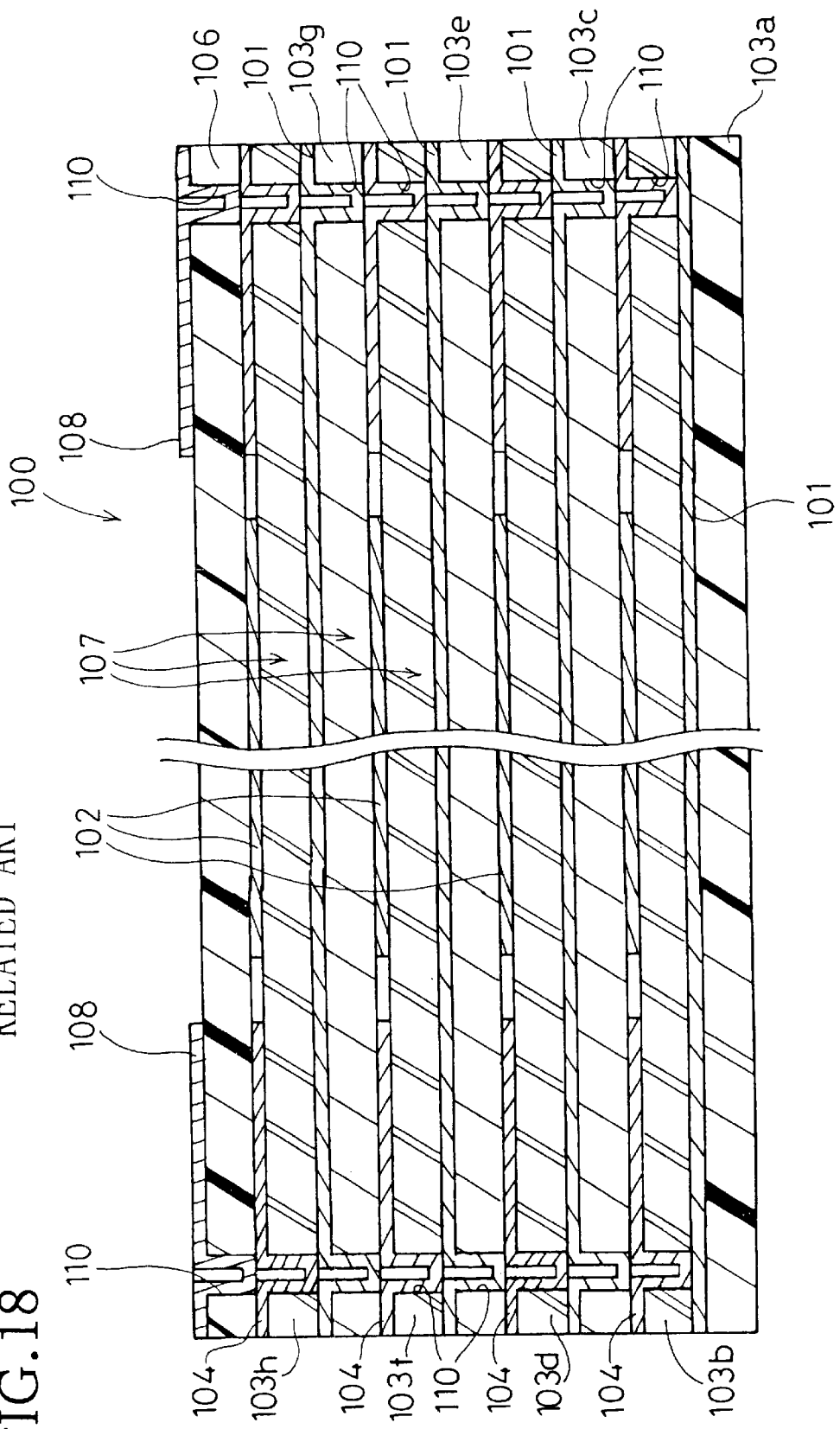
FIG. 18 is a cross sectional view of the piezoelectric actuator, taken along 1005—1005 of FIG. 17.
Figure 19:
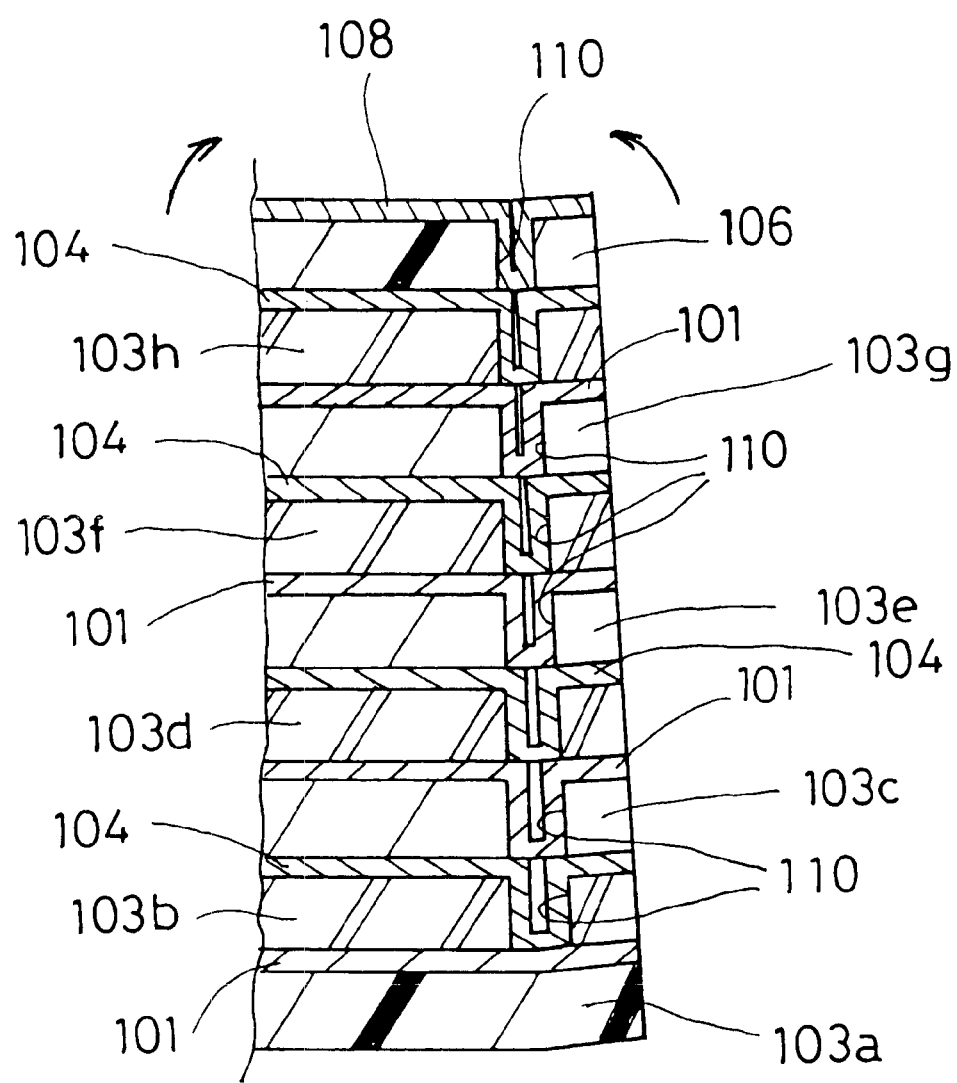
FIG. 19 is an explanatory view of the piezoelectric actuator in a deformed condition.

A piezoelectric actuator 320 according to a third embodiment will be described with reference to FIGS. 13 to 16D. As shown in FIGS. 13 to 15, the piezoelectric actuator 320 includes two piezoelectric sheets 322, 321 and an insulating sheet 323 that are laminated. Narrow individual electrodes 324 are provided on a surface (larger face) of the lowermost piezoelectric sheet 322, so as to laterally extend parallel to the shorter side of the piezoelectric sheet 322. A row of the individual electrodes 324 is provided along the longitudinal direction of the piezoelectric sheet 322. The individual electrodes 324 correspond to the pressure chambers 16 of the cavity plate 10. As shown in FIG. 14, an end 324a of the individual electrode 324 is extended to a longer side edge of the lowermost piezoelectric sheet 322.

A common electrode 325 that is common to a plurality of the pressure chambers 16 is formed on a surface (larger face) of the second layer of the piezoelectric sheet 321 into a substantially rectangular shape, so as to fully cover the pressure chambers 16. Extending portions 325a are integrally formed with the common electrode 325 and extend laterally so as to cover a substantially entire length of each shorter side end of the piezoelectric sheet 321. The extending portions 325a are extended so as to be exposed on longer side faces of the piezoelectric sheet 321. In the piezoelectric sheet 321, piezoelectric active portions 335 that are deformed by the piezoelectric effects, are provided at positions sandwiched between the individual electrodes 324 and the common electrode 325.

Individual dummy electrodes 326 are formed so as to correspond to the individual electrodes 324 (in the substantially same vertical positions), on a surface of the second piezoelectric sheet 321 where the piezoelectric active portions 335 are not provided. Dummy common electrodes 327 are formed on the lowermost piezoelectric sheet 322 at positions corresponding to the extending portions 325a (in the substantially same vertical positions). An end 326a of the individual dummy electrode 326 is extended to a longer side edge of the piezoelectric sheet 321. Similarly, an end 327a of the dummy common electrode 327 is extended to a longer side edge of the lowermost piezoelectric sheet 322. In the third embodiment, each electrode 324, 325, 326, 327 are formed of electrically conductive Ag—Pd-based paste.

Tabs 360, 361 are formed of electrically conductive Ag—Pd-based paste so as to correspond to the individual electrodes 324 and the extending portions 325a, respectively on the topmost insulating sheet 323 along each longer side end of the sheet 323. Surface electrodes 330, 331 to be connected to the flexible printed cable 40 are formed over the tabs 360, 361, respectively. In the third embodiment, the surface electrodes 330, 331 are formed of Ag-based material of which Ag is a main ingredient of the electrically conductive Ag—Pd-based paste forming the tabs 330, 331.

Side electrodes 350 that connect, in the sheet laminated direction, the ends 324a of the individual electrodes 324 extended to the edge of the piezoelectric sheet 322 and the ends 326a of the individual dummy electrodes 326 extended to the edge of the piezoelectric sheet 321 are provided on side surfaces orthogonal to the upper and lower larger surfaces of the piezoelectric actuator 320 along the longitudinal direction of the actuator 320, as shown in FIG. 13. Similarly, side electrodes 351 that connect, in the sheet laminated direction, the extending portions 325a of the common electrode 325 and the ends 327a of the dummy common electrodes 327 are provided on side surfaces orthogonal to the upper and lower larger surfaces of the piezoelectric actuator 320, along the longitudinal direction of the actuator 320. The side electrodes 350, 351 are formed on the electrically conductive Ag-based paste. Upper ends of the side electrodes 350, 351 are connected the associated surface electrodes 330, 331. Therefore, the individual electrodes 324 and the common electrode 325 are electrically connected to the surface electrodes 330, 331, via the side electrodes 350, 351.

Recessed grooves 62, 63 are formed in the base plate 14 of the cavity plate 10 at positions associated with the longer side ends of the piezoelectric actuator 320, so as to extend along the longitudinal direction of the cavity plate 10. Due to the recessed grooves 62, 63, the lower ends of the side electrodes 350, 351 do not make contact with the cavity plate 10, so that occurrence of short circuit in the side electrodes 350, 351 can be prevented.

A method of manufacture of the piezoelectric actuator 320 will be described below with reference to FIGS. 16A through 16D. A fourth base sheet (green sheet) whose size covers a plurality of the piezoelectric sheets 322 arranged in a matrix, is prepared. The individual electrodes 324 and the dummy common electrodes 327 are formed of the electrically conductive Ag—Pd-based paste by screen printing on the surface of the forth base sheet.

Similarly, a fifth base sheet (green sheet) whose size covers a plurality of the piezoelectric sheets 321 arranged in a matrix, is prepared. The common electrode 325 and the individual dummy electrodes 326 are formed of the electrically conductive Ag—Pd-based paste by screen printing on the surface of the fifth base sheet.

Further, a sixth base sheet (green sheet) whose size covers a plurality of the insulating sheets 323 arranged in a matrix, is prepared. The tabs 360, 361 are formed of the electrically conductive Ag—Pd-based paste by screen printing, at positions associated with the individual electrodes 324 (the dummy individual electrodes 326) and the extending portions 325a of the common electrode 325 (the dummy common electrodes 327), respectively on the surface of the sixth base sheet.

In the third embodiment, the area of each tab 360, 361 after being fired at a high temperature is set to be about a half (½) of the area of the corresponding surface electrode 330, 331 or greater, but up to the equal size of the area of the corresponding surface electrode 330, 331.

The fourth to sixth base sheets are laminated after being dried. The base sheets are pressed in the laminated direction, to form a single laminate (FIG. 16A). The laminate is sintered or fired at approximately 1100° C. The tabs 360, 361 formed on the insulating sheet 323 shrink due to the heat applied during firing, as shown in FIG. 16B. The area of each of the tabs 60, 61 is reduced to be about a half (½) of the area of the corresponding surface electrode 330, 331 or greater, but up to the equal size of the area of the corresponding surface electrode 330, 331, similar to the first embodiment.

Thereafter, the laminate is cut into a predetermined size. As shown in FIG. 16C, the orientation of the thus obtained laminate of the sheets 321–323 is changed such that a side face of the laminate faces upwardly. The side electrodes 350 are formed of the electrically conductive Ag-based paste so as to connect the ends 324a of the individual electrodes 324 and the ends 326a of the individual dummy electrodes 326. Similarly, the side electrodes 351 are formed of the electrically conductive Ag-based paste so as to connect the extending portions 325a of the common electrodes 325 and the ends 327a of the dummy common electrodes 327.

The orientation of the laminate of the sheets 321–323 is changed again such that the other side face of the laminate faces upwardly. The side electrodes 350, 351 are formed by screen printing in the same manner as described above.

Thereafter, as shown in FIG. 16D, the orientation of the laminate of the sheets 321–323 is changed again such that the larger face (having the tabs 360, 361 formed thereon) of the laminate faces upwardly. The surface electrodes 330 are formed of the electrically conductive Ag-based paste by the screen printing so as to cover the tabs 360 formed on the insulating sheet 323 and so as to make connection to the upper end of the corresponding side electrodes 350.

Similarly, the surface electrodes 331 are formed of the electrically conductive Ag-based paste by the screen printing so as to cover the tabs 361 formed on the insulating sheet 323 and so as to make connection to the upper end of the corresponding side electrodes 351. Then, the side electrodes 350, 351 and the surface electrodes 330, 331 are baked at approximately 600° C.

As shown in FIG. 15, in the piezoelectric sheets 321, 322 and the insulating sheet 323 laminated vertically, the individual electrodes 324, the individual dummy electrodes 326, and the surface electrodes 330 associated with each other are electrically connected through the associated side electrodes 350. The common electrode 325, the dummy common electrodes 327, and the surface electrodes 331 associated with each other are electrically connected through the associated side electrodes 351.

In the third embodiment, when the surface electrodes 330, 331 are formed on the surface of the insulating sheet 323 of the piezoelectric actuator 320, the surface electrodes 330, 331 are securely attached by baking at a lower temperature (600° C. in the third embodiment), to the tabs 360, 361 secured on the insulating sheet 323 by firing at a high temperature (1100° C. in the third embodiment). The surface electrodes 330, 331 are bonded to the tabs 360, 361 with the increased bonding strength, because metals including the same type of the main ingredient (i.e., Ag in the third embodiment) are bonded to each other.

Even though the surface electrodes 330, 331 are not fired at high temperatures, the surface electrodes 330, 331 are bonded to the insulating sheet 323 with a sufficient strength by the tabs 360, 361 serving as binders. Similar to the first embodiment, for example, when the surface electrodes 330, 331 are soldered to the flexible printed cable 40, the surface electrodes 330, 331 are prevented from peeling off the insulating sheet 323, resulting in the reduction of such defects.

The area of the tabs 360, 361 after being fired at a high temperature is about a half (½) of the area of the corresponding surface electrode 330, 331 or greater, but does not exceed the size equal to the area of the corresponding surface electrode 330, 331. Therefore, the tabs 360, 361 widely contact to the surface electrodes 330, 331, so that the sufficient bonding strength between the surface electrodes 330, 331 and the insulating sheet 323 are ensured. As described above, the piezoelectric actuator 320 of the third embodiment is reliably manufactured.

The flexible printed cable 40 is pressed onto the upper surface of the piezoelectric actuator 320, so that the wiring pattern (not shown) formed on the flexible printed cable 40 can be electrically connected to the surface electrodes 330, 331. The surface electrodes 330, 331 are not fired at high temperatures. Therefore, the surface electrodes 330, 331 are less subjected to oxidation. In addition, the surface electrodes 330, 331 are thicker than the tabs 360, 361 (about 7 to about 17 μm in the third embodiment). Therefore, sufficient bonding strength is ensured for bonding the surface electrodes 330, 331 and the flexible printed cable 40 by soldering.

While the invention has been described with reference to the exemplary embodiments, it is to be understood that the invention is not restricted to the particular forms shown in the foregoing exemplary embodiments. Various modifications and alterations can be made thereto without departing from the scope of the invention, as set forth in the appended claims.

For example, the piezoelectric actuator 20 includes the piezoelectric sheet 22 of an insulating material at the bottom. However, other insulating material may be used if the insulating material transmits the forces of deformation caused in the other piezoelectric sheets of the piezoelectric actuator 20, to the pressure chambers 16. Further, an insulating material other than the insulating sheet 23 may be used for the topmost sheet of the piezoelectric actuator 20. In this case, it is desirable that the insulating material controls or restrains the upward deformation (opposite to the cavity plate 10) caused in the piezoelectric sheets of the piezoelectric actuator 20.

In the first embodiment, one of the individual electrodes 24 in the middle of a row of the individual electrodes 24 is designated as the extended individual electrode 24X. However, the position where the extended individual electrode 24X is provided is not limited to the middle of a row of the individual electrodes 24. The extended individual electrode 24X may be provided in another position. The number of the extended individual electrode 24X provided in the first embodiment is one. However, a plurality of the extended individual electrodes 24X may be provided in a row of the individual electrodes 24. With a plurality of the extended individual electrodes 24X, the positions of the individual electrodes 24 can be more easily understandable in comparison with a single extended individual electrode 24X provided on a row of the individual electrodes 24.

In the first embodiment, the individual dummy electrodes 26, and the surface electrodes 30 associated with the extended individual electrodes 24X are all extended to an edge of the relevant sheet 21a–21g, 22, 23. However, the electrodes 24, 26, 30 do not have to be extended on every sheet 21a–21g, 22, 23 for the purpose of the assembly of the piezoelectric actuator 20 with the cavity plate 10. As long as the individual electrode 24 is extended in at least one of the piezoelectric sheets closer to the cavity plate 10 such that the position of the individual electrode 24 is identified, the electrodes 24, 26, 30 extended to an edge of the sheets may be eliminated in some piezoelectric sheets and the insulating sheet.

The common electrode 25 may be provided, similar to the individual dummy electrodes 26, so as to correspond to each of the pressure chambers 16. Such common electrodes 25 may be extended to an edge of the piezoelectric sheets 21a, 21c, 21e, 21g. Therefore, with the individual electrodes 24 and the common electrodes 25 extended to the edge of the piezoelectric sheets 22, 21a–21g, the positions of the internal electrodes of the individual electrodes 24 and the common electrodes 25 may be identified on a side face of the piezoelectric actuator 20.

What is claimed is:

1. A laminated piezoelectric element, comprising:
   a plurality of sheet members that include at least a plurality of piezoelectric sheets and that form a laminate by stacking the plurality of the sheet members;
   electrode patterns that include at least first electrode patterns including a plurality of individual electrodes on each one of the first electrode patterns formed between the sheet members; and
   through holes that pierce through at least one of the sheet members to be internal layers of the laminate at least corresponding to the individual electrodes, the through holes electrically connect at least between the first electrode patterns by each of the individual electrodes adjacent in a lamination direction of the sheet members with an electrically conductive material applied to the through holes,
   wherein the through holes are provided so as to prevent the through holes adjacent in a direction parallel to an alignment of the individual electrodes in the first electrode pattern from aligning along the direction parallel to the alignment of the individual electrodes in the at least one of the sheet members.

2. The laminated piezoelectric element according to claim 1, wherein the electrode patterns consist of the first electrode patterns and second electrode patterns that include common electrodes formed between the sheet members, and
   wherein the through holes are further provided corresponding to the common electrodes, and the through holes provided for the common electrodes electrically connect between the second electrode patterns adjacent in a lamination direction of the sheet members with an electrically conductive material applied to the through holes.

3. The laminated piezoelectric element according to claim 2, wherein the first electrode patterns and the second electrode patterns are alternately and overlappingly stacked on each other with the sheet members interposed therebetween.

4. The laminated piezoelectric element according to claim 3, wherein the first electrode patterns further include dummy common electrodes and the second electrode patterns further include a plurality of individual dummy electrodes, and
   wherein the individual electrodes adjacent in the lamination direction are electrically connected via the through holes and the individual dummy electrodes, and the common electrodes adjacent in the lamination direction are electrically connected via the through holes and the dummy common electrodes.

5. The laminated piezoelectric element according to claim 2, wherein the laminate has an electrode pattern of a plurality of surface electrodes that make connections to an external connecting device, on at least one outer surface of the laminate orthogonal to the lamination direction,
   wherein the individual electrodes or the common electrodes associated with the surface electrodes are electrically connected via the through holes provided in an uppermost one of the sheet members having the electrode pattern of the surface electrodes, and
   wherein the through holes provided for the surface electrodes are disposed so as to prevent the through holes adjacent in the direction parallel to the alignment of the surface electrodes from aligning along the direction parallel to the alignment of the surface electrodes.

6. The laminated piezoelectric element according to claim 2, wherein the through holes that are provided for the individual electrodes or the common electrodes electrically connected in the lamination direction are disposed so as to prevent the adjacent through holes in the laminated direction from aligning.

7. The laminated piezoelectric element according to claim 3, wherein each first electrode pattern formed between the sheet members has a same electrode pattern and each second electrode pattern formed between the sheet members has a same electrode pattern.

8. The laminated piezoelectric element according to claim 2, wherein, in either one of the first electrode pattern and the second electrode pattern formed in between the sheet members, a part of the electrode pattern at a predetermined position is extended to an edge of the sheet members and a remainder of the electrode pattern is not extended to the edge of the sheet members.

9. The laminated piezoelectric element according to claim 4, wherein, in either one of the first electrode pattern and the second electrode pattern formed in between the sheet members, a part of the electrode pattern at a predetermined position is extended to an edge of the sheet members and a remainder of the electrode pattern is not extended to the edge of the sheet members.

10. The laminated piezoelectric element according to claim 8, wherein the part of the electrode pattern that is extended to the edge of the sheet members is the individual electrodes located at a substantially central portion of the first electrode pattern.

11. The laminated piezoelectric element according to claim 10, wherein the individual electrodes extended to the edge of the sheet members are extended straightly to the edge.

12. The laminated piezoelectric element according to claim 8, wherein the first electrode pattern includes two rows of the individual electrodes provided along a longitudinal direction of the sheet members, and each of the rows of the individual electrodes includes at least one of the individual electrodes extended to the edge of the sheet members.

13. The laminated piezoelectric element according to claim 3, wherein the laminated piezoelectric element further comprises a plurality of piezoelectric active portions that are provided at positions sandwiched between the individual electrodes and the common electrodes in the lamination direction, and the piezoelectric active portions are displaced so as to expand or contract in the lamination direction.

14. An ink-jet printer, comprising:
 a piezoelectric actuator including the laminate piezoelectric element according to claim 1; and
 a cavity plate that includes a plurality of nozzles and a plurality of pressure chambers provided for each of the nozzles and that is attached to the piezoelectric actuator.

* * * * *